(12) United States Patent
Miyatani et al.

(10) Patent No.: US 11,792,534 B2
(45) Date of Patent: Oct. 17, 2023

(54) SIGNAL PROCESSING DEVICE, SIGNAL PROCESSING METHOD, AND IMAGE CAPTURE DEVICE

(71) Applicant: SONY CORPORATION, Tokyo (JP)

(72) Inventors: Yoshitaka Miyatani, Tokyo (JP); Norihiko Akamatsu, Tokyo (JP); Noriaki Kozuka, Tokyo (JP); Shinichi Fujii, Tokyo (JP); Genta Yagyu, Tokyo (JP)

(73) Assignee: SONY CORPORATION ( * ) Notice: Subject to any disclaimer, the term of this patent is extended or adjusted under 35 U.S.C. 154(b) by 61 days.

(21) Appl. No.: 17/250,695

(22) PCT Filed: Jul. 18, 2019

(86) PCT No.: PCT/JP2019/028253
§ 371 (c)(1),
(2) Date: Feb. 19, 2021

(87) PCT Pub. No.: WO2020/044835
PCT Pub. Date: Mar. 5, 2020

(65) Prior Publication Data
US 2021/0203841 A1    Jul. 1, 2021

(30) Foreign Application Priority Data

Aug. 30, 2018    (JP) .................. 2018-161366

(51) Int. Cl.
H04N 23/80    (2023.01)
H04N 23/69    (2023.01)
(Continued)

(52) U.S. Cl.
CPC ............... *H04N 23/80* (2023.01); *G02B 7/28* (2013.01); *G02B 13/12* (2013.01); *G03B 13/36* (2013.01); *H04N 23/69* (2023.01)

(58) Field of Classification Search
CPC .......... H04N 5/23229; H04N 5/23296; H04N 5/232122; H04N 5/36961; H04N 9/04557;
(Continued)

(56) References Cited

U.S. PATENT DOCUMENTS 6,016,356 A    1/2000    Ito et al.
8,605,197 B2    12/2013    Ono
(Continued)

FOREIGN PATENT DOCUMENTS

CN    101155248 A    4/2008
CN    101223551 A    7/2008
(Continued)

OTHER PUBLICATIONS

International Search Report and Written Opinion of PCT Application No. PCT/JP2019/028253, dated Oct. 21, 2019, 17 pages of ISRWO.

*Primary Examiner* — Shahbaz Nazrul
(74) *Attorney, Agent, or Firm* — CHIP LAW GROUP

(57) ABSTRACT

A signal processing device, on the basis of an image capture signal acquired by an image capture device provided with an anamorphic lens, performs a detection process each in a vertical direction of the anamorphic lens and in a horizontal direction of the anamorphic lens.

20 Claims, 15 Drawing Sheets

(51) Int. Cl.
  *G02B 7/28* (2021.01)
  *G02B 13/12* (2006.01)
  *G03B 13/36* (2021.01)

(58) Field of Classification Search
  CPC ...... H04N 23/80; H04N 23/69; H04N 25/134;
       H04N 23/672; H04N 25/704; G02B 7/28;
       G02B 13/12; G02B 13/08; G02B 7/36;
       G02B 7/34; G03B 13/36; G03B 3/10;
       H01L 27/14623; H01L 27/14627
  See application file for complete search history.

(56) References Cited

U.S. PATENT DOCUMENTS

| | | | |
|---|---|---|---|
| 2005/0276593 A1* | 12/2005 | Yamasaki | G03B 13/32 |
| | | | 396/114 |
| 2008/0075381 A1 | 3/2008 | Ishimaru | |
| 2008/0143881 A1 | 6/2008 | Tsukioka | |
| 2010/0060992 A1 | 3/2010 | Hirose | |
| 2010/0177979 A1 | 7/2010 | Kotani | |
| 2014/0313393 A1 | 10/2014 | Kinoshita et al. | |
| 2015/0319356 A1 | 11/2015 | Ohara | |
| 2016/0006924 A1 | 1/2016 | Takao | |
| 2017/0127048 A1* | 5/2017 | Nobayashi | H04N 13/128 |
| 2017/0192210 A1* | 7/2017 | Sasaki | G02B 13/08 |
| 2018/0075617 A1 | 3/2018 | Abe et al. | |
| 2019/0037202 A1 | 1/2019 | Uemori et al. | |

FOREIGN PATENT DOCUMENTS

| | | |
|---|---|---|
| CN | 103155543 A | 6/2013 |
| CN | 104125377 A | 10/2014 |
| CN | 108601511 A | 9/2018 |
| DE | 69530887 T2 | 3/2004 |
| DE | 69533117 T2 | 10/2005 |
| EP | 677780 A2 | 10/1995 |
| EP | 1107055 A2 | 6/2001 |
| EP | 1132864 A2 | 9/2001 |
| EP | 2624540 A1 | 8/2013 |
| EP | 3415076 A1 | 12/2018 |
| JP | 05-022643 A | 1/1993 |
| JP | 05-264886 A | 10/1993 |
| JP | 06-014239 A | 1/1994 |
| JP | 08-76302 A | 3/1996 |
| JP | 2001-141430 A | 5/2001 |
| JP | 2004-317970 A | 11/2004 |
| JP | 2006-003427 A | 1/2006 |
| JP | 2007-066138 A | 3/2007 |
| JP | 2008-083820 A | 4/2008 |
| JP | 2010-145775 A | 7/2010 |
| JP | 2010-161744 A | 7/2010 |
| JP | 2014-216715 A | 11/2014 |
| JP | 2015-210489 A | 11/2015 |
| JP | 2016-018012 A | 2/2016 |
| JP | 2016-057445 A | 4/2016 |
| JP | 2017-083427 A | 5/2017 |
| JP | 2017-138576 A | 8/2017 |
| JP | 2017-219737 A | 12/2017 |
| JP | 2018-046543 A | 3/2018 |
| KR | 10-2008-0028282 A | 3/2008 |
| WO | 2007/026899 A1 | 3/2007 |
| WO | 2008/062661 A1 | 5/2008 |
| WO | 2012/043211 A1 | 4/2012 |
| WO | 2017/138209 A1 | 8/2017 |

* cited by examiner

FIG. 3A
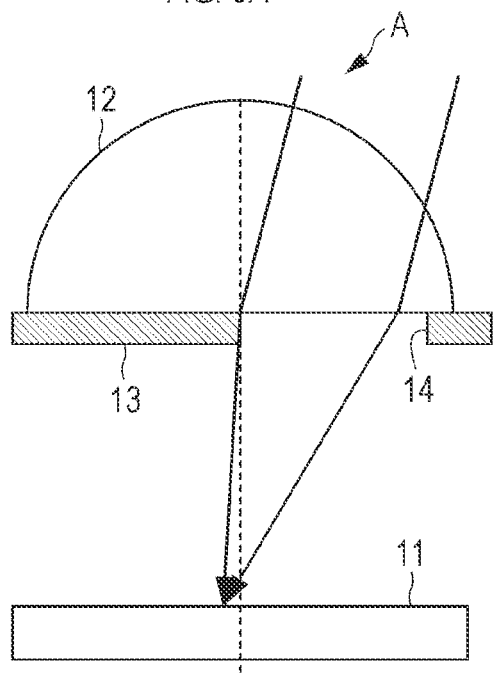
FIG. 3B
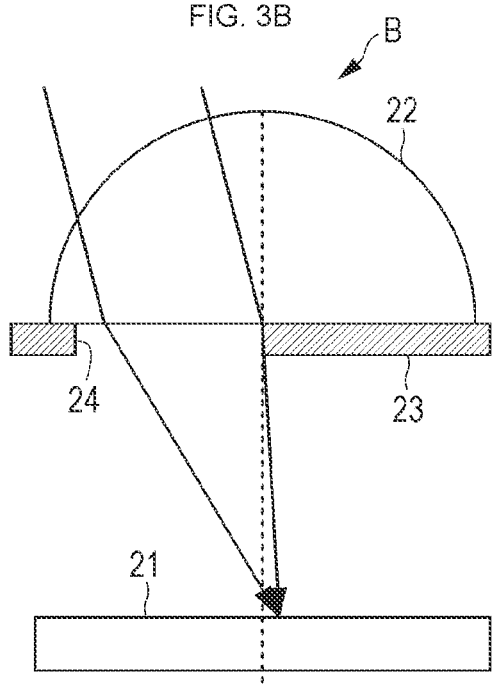
FIG. 3C

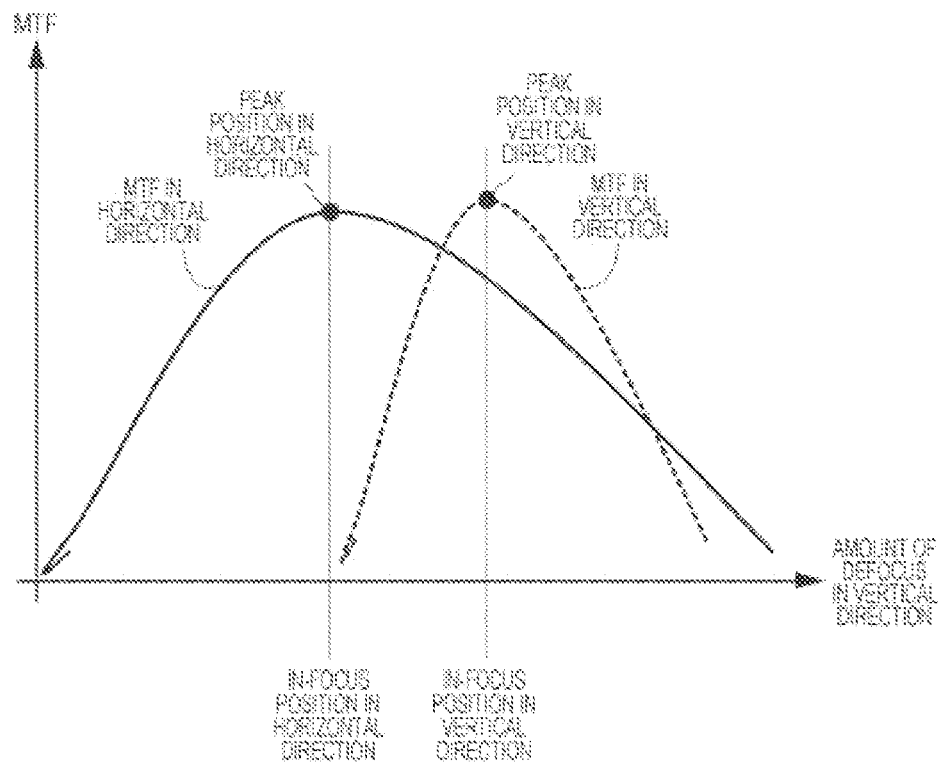

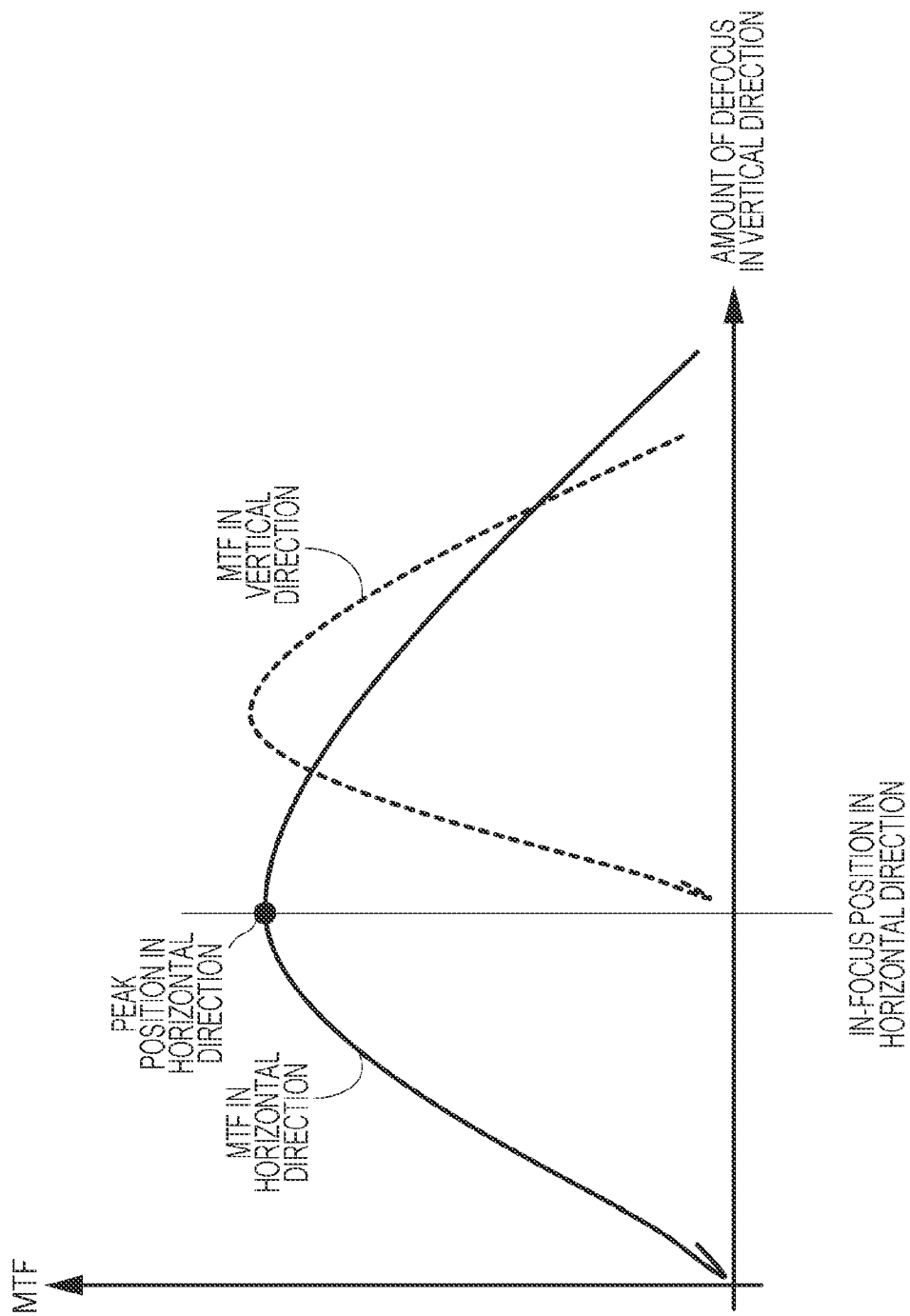

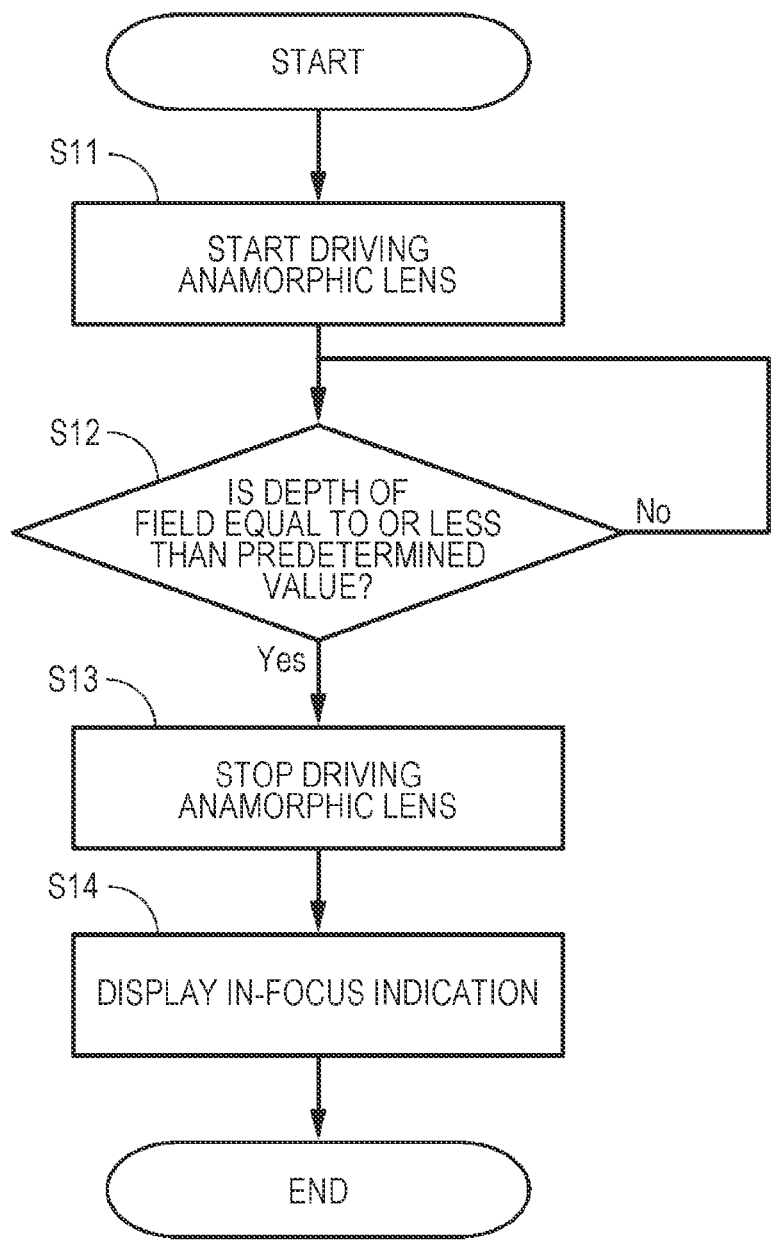

FIG. 12

| | FRONT FOCUS<br>HORIZONTAL DIRECTION: WITHIN DEPTH OF FIELD<br>VERTICAL DIRECTION: OUT OF DEPTH OF FIELD | HORIZONTAL DIRECTION: WITHIN DEPTH OF FIELD<br>VERTICAL DIRECTION: WITHIN DEPTH OF FIELD | BACK FOCUS<br>HORIZONTAL DIRECTION: WITHIN DEPTH OF FIELD<br>VERTICAL DIRECTION: OUT OF DEPTH OF FIELD |
|---|---|---|---|
| FIRST METHOD<br>EMPHASIZE IN-FOCUS AREA IN EACH OF VERTICAL DIRECTION AND HORIZONTAL DIRECTION | ○ | ○ | ○ |
| SECOND METHOD<br>EMPHASIZE EITHER VERTICAL DIRECTION OR HORIZONTAL DIRECTION WHOSE IN-FOCUS AREA IS NARROWER | ○ | ○ | ○ |
| THIRD METHOD<br>EMPHASIZE ONE OF VERTICAL DIRECTION OR HORIZONTAL DIRECTION STRONGLY AND EMPHASIZE THE OTHER WEAKLY | ○ | ○ | ○ |

SIGNAL PROCESSING DEVICE, SIGNAL PROCESSING METHOD, AND IMAGE CAPTURE DEVICE

CROSS REFERENCE TO RELATED APPLICATIONS

This application is a U.S. National Phase of International Patent Application No. PCT/JP2019/028253 filed on Jul. 18, 2019, which claims priority benefit of Japanese Patent Application No. JP 2018-161366 filed in the Japan Patent Office on Aug. 30, 2018. Each of the above-referenced applications is hereby incorporated herein by reference in its entirety.

TECHNICAL FIELD

The present technology relates to a signal processing device, a signal processing method, a signal processing program, and an image capture device.

BACKGROUND ART

A general camera lens is designed to be optically symmetrical in the rotation direction with respect to the lens optical axis. However, for example, a special lens such as an anamorphic lens used for cinema photography or the like is intentionally designed to have different optical characteristics in the horizontal and vertical directions.

An anamorphic lens is a lens that has different optical characteristics (focal length) in the vertical and horizontal directions. Generally, the anamorphic lens is designed so that the focal length in the horizontal direction is short, and an image is recorded in a state that the image is compressed in the horizontal direction when imaging. Then, by stretching the image in the horizontal direction when reproducing the image, it is possible to reproduce a horizontally long natural image being equal to or larger than an aspect of a recording element.

However, since the focal lengths are different between the vertical and horizontal directions, the depth of field changes between the vertical and horizontal directions, so there is a problem that focusing cannot be done like the general lens that is optically symmetric in the rotation direction with respect to the lens optical axis.

Therefore, a method that uses two focus lenses, one is a spherical lens (image plane positions in the vertical and horizontal directions move simultaneously), and the other is a cylindrical lens (only an image plane position either in the vertical or horizontal direction moves), has been proposed (Patent Document 1).

CITATION LIST

Patent Document

Patent Document 1: Japanese Patent Application Laid-Open No. H6-14239

SUMMARY OF THE INVENTION

Problems to be Solved by the Invention

However, the method described in Patent Document 1 uses a movable lens 34 and a focusing lens 20 as two lenses and realizes focusing by a two-step operation of operating the focusing lens 20 and then operating the movable lens 34. From the viewpoint of autofocus speed, it is inefficient to adjust the focus in such two steps.

The present technology has been made in view of such points, and an object of the present technology is to provide a signal processing device, a signal processing method, a signal processing program, and an image capture device, in which it is possible for also an image capture device provided with an anamorphic lens to perform processing related to focus adjustment appropriately.

Solutions to Problems

In order to solve the problems described above, the first technology is a signal processing device that, on the basis of an image capture signal acquired by an image capture device provided with an anamorphic lens, performs a detection process each in the vertical direction of the anamorphic lens and in the horizontal direction of the anamorphic lens.

Also, the second technology is a signal processing method including performing a detection process, on the basis of an image capture signal acquired by an image capture device provided with an anamorphic lens, each in the vertical direction of the anamorphic lens and in the horizontal direction of the anamorphic lens.

Also, the third technology is a signal processing program for, on the basis of an image capture signal acquired by an image capture device provided with an anamorphic lens, causing a computer to execute a signal processing method including performing a detection process each in the vertical direction of the anamorphic lens and in the horizontal direction of the anamorphic lens.

Furthermore, the fourth technology is an image capture device including an anamorphic lens, an image capture element provided with a plurality of phase difference detection pixels arranged to make placement densities different between a direction corresponding to a vertical direction of the anamorphic and a direction corresponding to a horizontal direction orthogonal to the vertical direction of the anamorphic lens, and a signal processing unit that performs a detection process each in the vertical direction of the anamorphic lens and in the horizontal direction of the anamorphic lens on the basis of an image capture signal acquired by the image capture element.

Effects of the Invention

According to the present technology, also in an image capture device provided with an anamorphic lens, it is possible to perform processing related to focus adjustment appropriately. Note that the effects described in the present disclosure are not necessarily limited, and the effects described in the present disclosure may be any of the effects described in the specification.

BRIEF DESCRIPTION OF DRAWINGS

FIGS. 3A, 3B, and 3C are explanatory diagrams of a phase difference detection pixel.

FIG. 4 is an explanatory diagram of a first aspect of autofocus control.

FIG. 5 is a diagram illustrating selection of an autofocus method to be used.

FIG. 6 is an explanatory diagram of a second aspect of the autofocus control.

FIG. 7 is a flowchart illustrating a flow of lens stopping process.

FIG. 12 is an explanatory diagram of peaking drawing.

MODE FOR CARRYING OUT THE INVENTION

Hereinafter, embodiments of the present technology will be described with reference to the drawings. Note that the description will be given in the following order.
<1. First Embodiment>
[1-1. Configuration of image capture device]
[1-2. About MTF characteristic in anamorphic lens]
[1-3. Processing in signal processing device]
[1-4. Processing of driving and stopping lens]
[1-5. Configuration of image capture element]
<2. Second Embodiment>
[2-1. Configuration of image capture device]
[2-2. Peaking process]
<3. Third Embodiment>
[3-1. Configuration of image capture device]
[3-2. First focus adjustment process by signal processing device: fine focus adjustment]
[3-3. Second focus adjustment process by signal processing device: focus bracket imaging]
<4. Modification Example>

First Embodiment

[1-1. Configuration of Image Capture Device]

Figure 1:
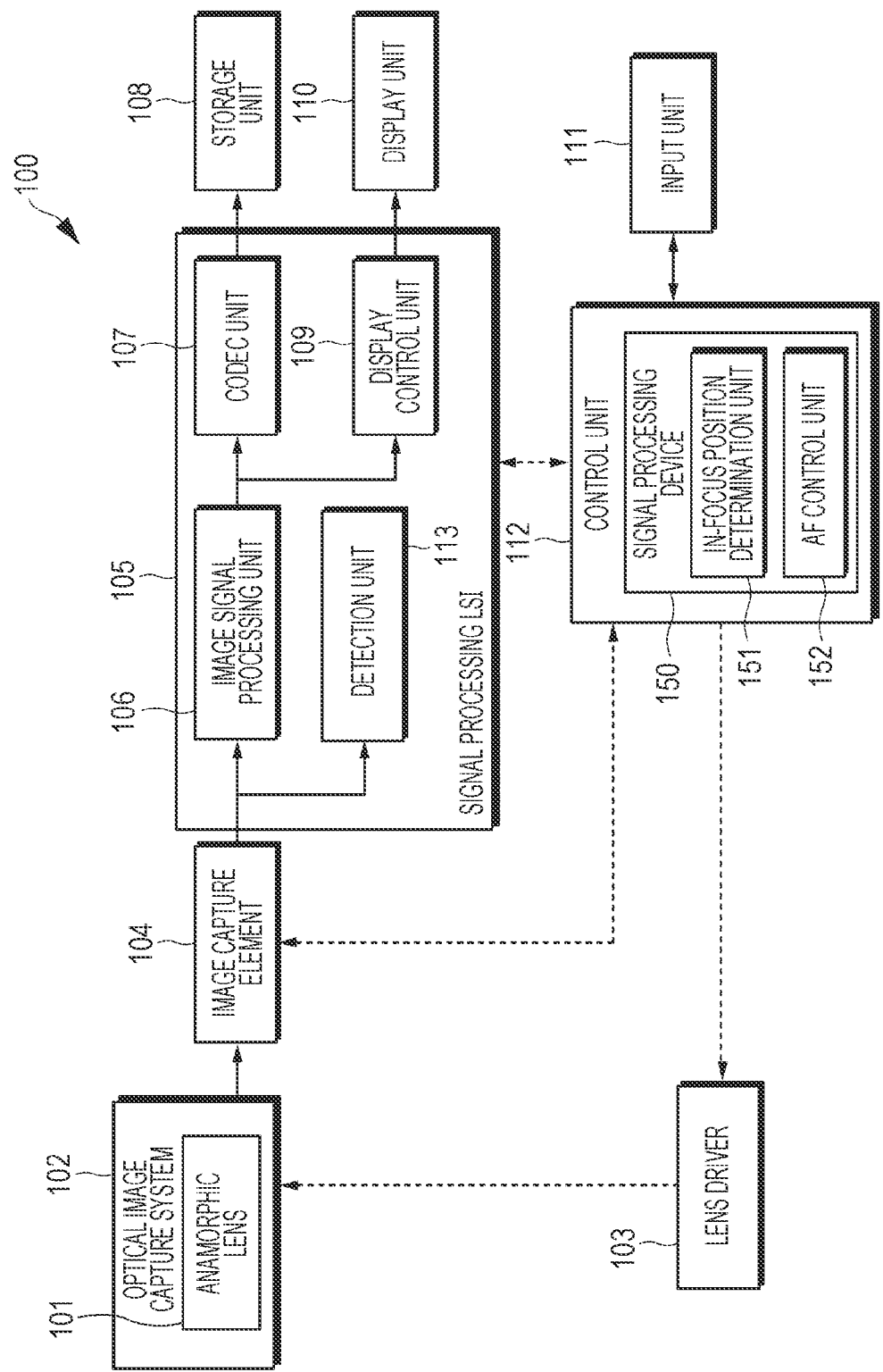
FIG. 1 is a block diagram illustrating a configuration of an image capture device according to a first embodiment.

First, a configuration of an image capture device 100 including a signal processing device 150 according to a first embodiment will be described with reference to FIG. 1. In the first embodiment, in the image capture device 100 provided with an anamorphic lens 101, an in-focus position is determined by a detection process, and an autofocus control is performed on the basis of the in-focus position. Note that detection in a case of image plane phase-detection autofocus (AF) is to detect the phase difference, and detection in a case of contrast detection AF is to detect a contrast.

The image capture device 100 includes an optical image capture system 102 including the anamorphic lens 101, a lens driver 103, an image capture element 104, a signal processing large-scale integration (LSI) 105, an image signal processing unit 106, a codec unit 107, a storage unit 108, a display control unit 109, a display unit 110, an input unit 111, a control unit 112, a detection unit 113, a signal processing device 150, an in-focus position determination unit 151, and an autofocus (AF) control unit 152.

The optical image capture system 102 includes the anamorphic lens 101 for concentrating light from a subject on the image capture element 104, a drive mechanism for zooming, a shutter mechanism, an iris mechanism, and the like. These are driven on the basis of a control signal from the control unit 112 and the lens driver 103. An optical image of the subject obtained through the optical image capture system 102 is formed on the image capture element 104 as an image capture component.

The lens driver 103 includes, for example, a microcomputer and the like, and controls operations such as driving of the anamorphic lens 101 for autofocus, the drive mechanism of the optical image capture system 102, the shutter mechanism, the iris mechanism, and the like in accordance with a control of the control unit 112. Accordingly, an exposure time (a shutter speed), an aperture value (an F value), and the like are adjusted.

The image capture element 104 photoelectrically converts the incident light from the subject into an electric charge amount and outputs as an analog image capture signal. The analog image capture signal output from the image capture element 104 is output to the image signal processing unit 106. As the image capture element 104, a charge-coupled device (CCD), a complementary metal-oxide semiconductor (CMOS), or the like is used.

The image signal processing unit 106, with respect to the image capture signal output from the image capture element 104, performs a sample hold by a correlated double sampling (CDS) processing for maintaining a good signal/noise (S/N) ratio, an auto gain control (AGC) processing, an analog/digital (A/D) conversion, and the like, and generates an image signal.

Also, the image signal processing unit 106 may perform predetermined signal processing such as demosaicing processing, white balance adjustment processing, color correction processing, gamma correction processing, Y/C conversion processing, auto exposure (AE) processing, resolution conversion processing on an image signal.

The codec unit 107 performs coding processing for recording or communication, for example, on the image signal that has been subjected to the predetermined processing.

The storage unit 108 is a large-capacity storage medium, for example, such as a hard disk, a memory stick (registered trademark of Sony Corporation), an SD memory card, and the like. An image is saved in a compressed state on the basis of standards, for example, such as Joint Photographic Experts Group (JPEG) and the like. Also, Exchangeable Image File Format (EXIF) data including information regarding the saved image and additional information such as imaging date and time and the like is also saved in association with the image. A moving image is saved in formats, for example, such as Moving Picture Experts Group 2 (MPEG-2), MPEG-4, and the like.

The display control unit 109 controls displaying generated image data on the display unit.

The display unit 110 is, for example, a display device including a liquid crystal display (LCD), a plasma display panel (PDP), an organic electroluminescence (EL) panel, or the like. The display unit 110 displays a user interface of the image capture device 100, a menu screen, a monitoring image during image capture, a captured image recorded in the storage unit 108, a captured moving image, and the like.

The input unit 111 includes, for example, a power button for switching between power on and power off, a release button for instructing to start recording an image, a zoom lever for adjusting zoom, a touch screen integrated with the display unit 110, and the like. When performing an input on the input unit 111, a control signal corresponding to the input is generated and output to the control unit 112. Then, the control unit 112 performs an arithmetic processing and control corresponding to the control signal.

The control unit 112 includes a central processing unit (CPU), a random access memory (RAM), a read-only memory (ROM), and the like. The ROM stores a program and the like that is read and executed by the CPU. The RAM is used as a work memory of the CPU. The CPU controls the entire image capture device 100 by executing various processes according to the program stored in the ROM and issuing commands.

Figure 2:
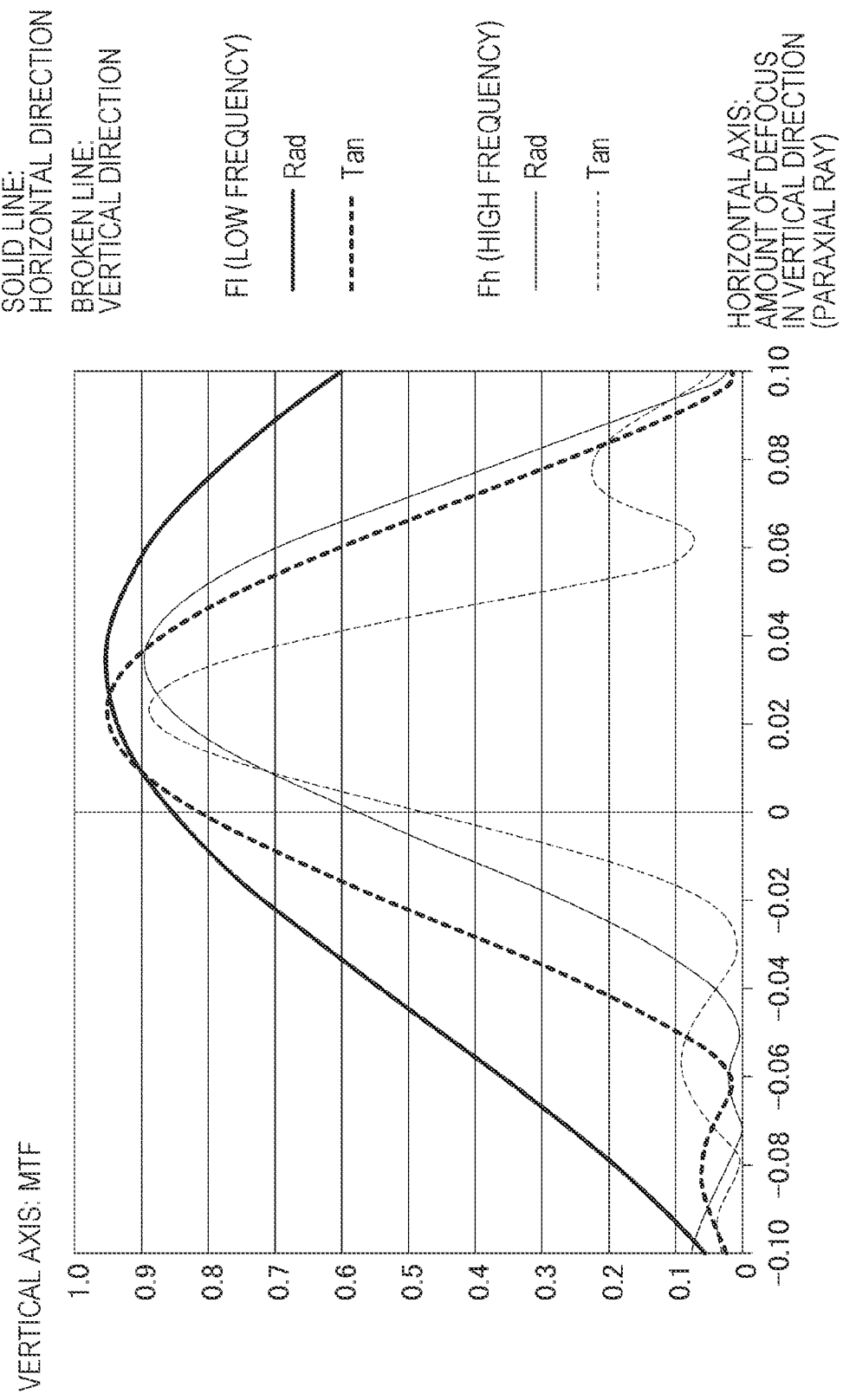
FIG. 2 is a graph illustrating an example of modulation transfer function (MTF) characteristics in an anamorphic lens.

The detection unit 113 uses the supplied image capture signal to perform the detection process in each of the vertical and horizontal directions of the image, determines an in-focus position of the subject in a detection range for auto-focus, and acquires an amount of defocus in all detection range. The amount of defocus is an amount of deviation from the focal point. Furthermore, the detection unit 113 acquires an MTF corresponding to the amount of defocus and generates detection information including the amount of defocus and the MTF as illustrated in FIG. 2. The detection information acquired by the detection unit 113 is supplied to the in-focus position determination unit 151. It should be noted that the vertical and horizontal directions of the image correspond to the vertical and horizontal directions of the anamorphic lens 101, respectively, and the vertical and horizontal directions are assumed to be orthogonal to each other.

The signal processing device 150 includes the in-focus position determination unit 151 and the AF control unit 152.

The in-focus position determination unit 151 determines the in-focus position of autofocus on the basis of the detection information supplied from the detection unit 113. A difference of focus to an in-focus position of the anamorphic lens 101 is an amount of focus deviation. The farther the position of the anamorphic lens 101 is from the in-focus position, the larger the amount of focus deviation, and the closer the position of the anamorphic lens 101 is to the in-focus position, the smaller the amount of focus deviation. Details of the processing by the in-focus position determination unit 151 will be described later. The determined in-focus position information is supplied to the AF control unit 152.

By driving the lens driver 103 on the basis of the in-focus position information supplied from the in-focus position determination unit 151, the AF control unit 152 performs autofocus control to move the anamorphic lens 101 by a predetermined amount along the optical axis direction to focus on the subject.

Note that the signal processing device 150 includes a program, and the program may be installed in the image capture device 100 preliminarily or may be distributed by download, storage medium, or the like so that the user can install the program by himself/herself. Note that the signal processing device 150 is not only realized by a program, but may also be realized by combining a dedicated device, a circuit, or the like by hardware having the function.

The image capture device 100 is configured as described above.

[1-2. About MTF Characteristic in Anamorphic Lens]

Next, MTF characteristics of the anamorphic lens 101 will be described. FIG. 2 is a graph illustrating an example of modulation transfer function (MTF) characteristics in the anamorphic lens 101. MTF is one of the indexes for evaluating the performance of a lens and indicates as a spatial frequency characteristic how faithfully the contrast of the subject can be reproduced in order to know an image formation performance of the lens. The MTF at a specific spatial frequency corresponds to a resolution and indicates that the larger the value, the higher the resolution. In FIG. 2, the horizontal axis indicates a paraxial ray position of the optical system in the horizontal direction. Also, the vertical axis indicates the MTF. In FIG. 2, a solid line indicates the MTF characteristics in the horizontal direction, and a broken line indicates the MTF characteristics in the vertical direction. Also, MTF characteristics at Fl (low frequency) are illustrated by a thick line, and MTF characteristics at Fh (high frequency) are illustrated by a thin line.

The anamorphic lens 101 generally has a shorter focal length and a greater depth of field, in the horizontal direction than in the vertical direction. As a result, in a case where the horizontal axis of the graph in FIG. 2 is the amount of defocus, there is a feature that the MTF characteristic is less likely to decrease in the horizontal direction even if the amount of defocus is the same in the vertical and horizontal directions. Also, it is possible to mention that the inclination of the MTF characteristic differs between the vertical and horizontal directions. Therefore, it is possible to mention that an image is blurred faster in the vertical direction compared to the horizontal direction. As a result, even with the same amount of defocus, in the vertical direction compared to the horizontal direction, the MTF tends to decrease so that the image looks blurred. Also, it is possible to mention that a range of the amount of defocus, which is regarded to be in focus, is wider in the horizontal direction compared to the vertical direction.

Furthermore, a peak position of the MTF characteristic differs between the vertical and horizontal directions. While up to depend on the optical design, it is difficult to match the peak positions of the MTF characteristics between the vertical and horizontal directions under all conditions. Note that the MTF characteristics between the vertical and horizontal directions also change depending on a frequency of the subject. Note that it is assumed that the vertical direction and the horizontal direction are orthogonal to each other.

Normally, detection in autofocus is performed in the horizontal direction. However, in the anamorphic lens 101, since the inclination of the MTF characteristic differs between the vertical and horizontal directions, if detection is performed only in the horizontal direction, autofocus in the vertical direction does not function normally.

[1-3. Processing in Signal Processing Device]

Next, by the signal processing device 150 including the in-focus position determination unit 151 and the AF control unit 152, an autofocus control in the image capture device 100 including the anamorphic lens 101 will be described. Note that, in the following description being made, autofocus shall be image plane phase-detection AF.

FIG. 4 is a diagram illustrating a configuration of a general phase difference detection pixel for performing image plane phase-detection AF. FIG. 4A illustrates a first phase difference detection pixel A, FIG. 4B illustrates a second phase difference detection pixel B, and FIG. 4C is a diagram illustrating an arrangement of pixels in the image capture element 104.

The first phase difference detection pixel A includes a light-receiving element 11. Also, a microlens 12 is provided on an incident side of the light. Furthermore, a light-shielding layer 13 that blocks incident light is provided between the light-receiving element 11 and the microlens 12 in order to perform pupil division. The light-shielding layer 13 has an opening 14 eccentric to one side direction with respect to the center of the light-receiving element 11. The first phase difference detection pixel A is configured as described above, and only a part of the incident light enters into the light-receiving element 11.

The second phase difference detection pixel B includes a light-receiving element 21. Also, a microlens 22 is provided on the incident side of the light. Furthermore, a light-shielding layer 23 that blocks incident light is provided between the light-receiving element 21 and the microlens 22 in order to perform pupil division. The light-shielding layer 23 has an opening 24 eccentric to one side direction with respect to the center of the light-receiving element.

The light-shielding layer 23 is configured to block a side opposite to the direction blocked by the light-shielding layer 13 in the first phase difference detection pixel A. As a result, the first phase difference detection pixel A and the second phase difference detection pixel B are configured to block light on each opposite side with respect to a distance measurement direction. The second phase difference detection pixel B is configured as described above, and only a part of the incident light enters into the light-receiving element 21.

The phase difference detection pixels configured as described above are arranged in the image capture element as illustrated in FIG. 3C. By using output from this phase difference detection pixel, it is possible to perform so-called image plane phase-detection AF. Note that the phase difference detection pixel may function only as a phase difference detection pixel and may not function as a normal pixel, or, by composing one pixel with two independent photodiodes, the phase difference detection pixel may also function as for image capture and phase difference detection.

First, a first aspect of the autofocus control will be described with reference to FIG. 4. The first aspect is a case where detection in the vertical and horizontal directions can be performed by image plane phase-detection AF. In the graph of FIG. 4, in a case where the vertical axis is MTF and the horizontal axis is the amount of defocus in the vertical direction, an example of the MTF characteristics in the vertical direction and the MTF characteristics in the horizontal direction when imaging the subject is illustrated. In image plane phase-detection AF, it is possible to calculate a peak position of MTF characteristic in each of the vertical and horizontal directions as the amount of defocus. In FIG. 4, also, as described above, the anamorphic lens 101 has different peak positions between the vertical and horizontal directions.

Since the image capture device 100 has one focus mechanism, even if the peak positions between the vertical and horizontal directions are different, it is necessary to determine any one of the in-focus positions to be focused on. Therefore, in the present embodiment, the in-focus position is determined to be one by the following method.

After the in-focus position is determined, the lens driver 103 causes the anamorphic lens 101 to operate under the control of the AF control unit 152 on the basis of the in-focus position information to perform autofocus.

Firstly, in a first method, a position corresponding to a mean amount of defocus between the amount of defocus corresponding to the peak position of the MTF characteristic in the vertical direction and the amount of defocus corresponding to the peak position of the MTF characteristic in the horizontal direction is set as the in-focus position. As a result, it is possible to set a position that is well-balanced with respect to both of the vertical and horizontal directions as the in-focus position.

Also, in a second method, a position where a value P1 calculated by the following evaluation formula [1] becomes the largest is set as the in-focus position. In this second method, the in-focus position is set to a position considering high MTF characteristics.

$$P1 = \text{MTF}_H(\text{focus})^2 + \text{MTF}_V(\text{focus})^2 \quad \text{[Formula 1]}$$

Also, in a third method, a tilt component of the subject (a subject angle is regarded as R) is added to the element for determining the in-focus position, and a position where a value P2 calculated by the following evaluation formula [2] where the subject angle R is applied to Formula 1 of the second method described above becomes the largest is set as the in-focus position. Since the subject normally inclines in the image, according to this third method that can determine the in-focus position according to the inclination of the subject, it is possible to perform more precise autofocus control.

$$P2 = (\text{MTF}_H(\text{focus}) \cdot \cos R)^2 + (\text{MTF}_V(\text{focus}) \cdot \sin R)^2 \quad \text{[Formula 2]}$$

Also, a fourth method is to determine a position on the basis of a degree of reliability of the detection results in the vertical and horizontal directions. The degree of reliability will be described here.

Block matching is generally used for detection of phase-detection AF, and the sum of absolute difference (SAD) is one of the methods for calculating the degree of similarity in block matching. In the SAD, "the sum of the absolute value of the differences between each pixel value" is an evaluation value for evaluating the degree of similarity. The place where the value becomes the smallest is the place where the similarity becomes the highest. Therefore, in a case where the SAD is equal to zero, the case means that the degree of reliability of detection is high, and the larger the value of the SAD, the lower the degree of reliability.

Block matching is performed in each of the vertical and horizontal directions to calculate the degree of reliability, and the peak position having the higher degree of reliability in either the vertical or horizontal direction is set as the in-focus position.

Also, in a fifth method, the vertical direction is prioritized, and the peak position of the MTF characteristic in the vertical direction is set as the in-focus position. It is because, as described with reference to FIG. 2, in the anamorphic lens 101, the inclination of the MTF characteristic is different between the vertical and horizontal directions, and the range of the amount of defocus where the MTF values are in the higher range is narrower in the vertical direction, the focusing accuracy may be higher. Therefore, in the fifth method, the vertical direction is prioritized.

Furthermore, in a sixth method, the tilt component of the subject (similar to the subject angle R in the third method) is detected, and the in-focus position is adjusted to either the vertical direction or the horizontal direction depending on whether the subject angle R is greater than or less than 45 degrees. In the present embodiment, in a case where the subject angle R is greater than 45°, the in-focus position in the vertical direction is used, and in a case where the subject angle R is less than 45°, the in-focus position in the horizontal direction is used.

As described above, in the first aspect of the autofocus control, there are the first to sixth methods described above. It is possible to determine which method is to be used by the criteria illustrated in FIG. 5 on the basis of whether the MTF characteristics are present or absent and whether the subject angle is present or absent.

In a case where the MTF characteristics are present, and the subject angle can be obtained by calculation, it is good to use the third method. This third method is the most accurate method among the first to sixth methods.

Also, in a case where the MTF characteristics are present, and the subject angle is not calculated or cannot be calculated, it is good to use the second method.

Also, in a case where the MTF characteristic is absent and the subject angle can be obtained by calculation, it is good to use the sixth method.

Furthermore, in a case where the MTF characteristic is absent, and the subject angle is not calculated or cannot be calculated, it is good to use any one of the first method, the fourth method, and the fifth method. Which one to use may be set by the user or may be set by default at the time of manufacturing the image capture device 100 or the signal processing device 150.

Note that it is also possible to obtain the final in-focus position by averaging the in-focus positions determined by some of the first to sixth methods described above.

Also, the user may be able to select which of the first to sixth methods is to be used. On that occasion, it is also possible to provide scene information or the like suitable for each of the first to sixth methods to the user.

Next, the second aspect of the autofocus control will be described with reference to FIG. 6 The second aspect is a case where image plane phase-detection AF can perform detection only in the horizontal direction. In this case, any one of the first, second, and third methods among the first to sixth methods in the first aspect described above is used. It is because the fourth to sixth methods cannot be used unless it is possible to perform detection in both vertical and horizontal directions. Note that examples of the configuration that can perform detection only in the horizontal direction are, for example, a case that AF pixels are arranged so as to detect only in the horizontal direction because the image quality will deteriorate if AF pixels are arranged so as to perform detection in both vertical and horizontal directions, a case that detection is performed only in the horizontal direction in order to reduce the processing load, and the like.

In a case of using the first, second, or third method, the vertical MTF characteristics and peak position are required. Therefore, the vertical MTF characteristics and peak position are kept as set values preliminarily. After using the criteria described in FIG. 5 to determine which method to use among the first, second, and third methods, the MTF characteristics and peak position that are kept are used when performing that method.

Note that, since the MTF characteristics and peak position change depending on parameters, for example, the state of the anamorphic lens 101 (such as zoom, focus, F value, and the like), image height, and subject frequency, combinations of the corresponding MTF characteristics and peak position for each parameter are kept as a table.

[1-4. Processing of Driving and Stopping Lens]

Next, the drive and stop processing of the anamorphic lens 101 in the autofocus control will be described with reference to the flowchart of FIG. 7.

After determining the in-focus position by the process described above, first, in step S11, the driving of the anamorphic lens 101 is started according to the autofocus control by the AF control unit 152. This start of driving the anamorphic lens 101 is performed by the lens driver 103 that causes the anamorphic lens 101 to operate under the control of the AF control unit 152.

Next, in step S12, it is determined by detection whether or not the value of the depth of field in the vertical direction is equal to or less than a predetermined value. This predetermined value is, for example, 1. In this step S12, the depth of field in the vertical direction is used, and the driving of the anamorphic lens 101 is not stopped even if the depth of field in the horizontal direction is equal to or less than a predetermined value. This is because, as described with reference to FIG. 2, in the anamorphic lens 101, the MTF characteristics tend to decrease in the vertical direction compared to the horizontal direction, and the range of the amount of defocus which is regarded to be in focus is narrow, it is possible to perform a process of stopping driving the lens linked with focusing more accurately by using the vertical direction as a reference.

In a case where the depth of field is not equal to or less than the predetermined value, the process returns to step S12, and the determination in step S12 is repeated until the depth of field becomes equal to or less than the predetermined value (No in step S12).

Then, in a case where the depth of field becomes equal to or less than a predetermined value, the process proceeds to step S13 (Yes in step S12). In a case where the depth of field becomes equal to or less than a predetermined value, it can be said that the subject is in focus. Therefore, in step S13, the driving of the anamorphic lens 101 is stopped. This stop of driving the anamorphic lens 101 is performed by the lens driver 103 that causes the anamorphic lens 101 to stop driving under the control of the AF control unit 152. Then, in step S14, an in-focus indication is displayed on the display unit 110 of the image capture device 100. As a result, the user can recognize that the subject is in focus.

[1-5. Configuration of Image Capture Element]

Figure 8:
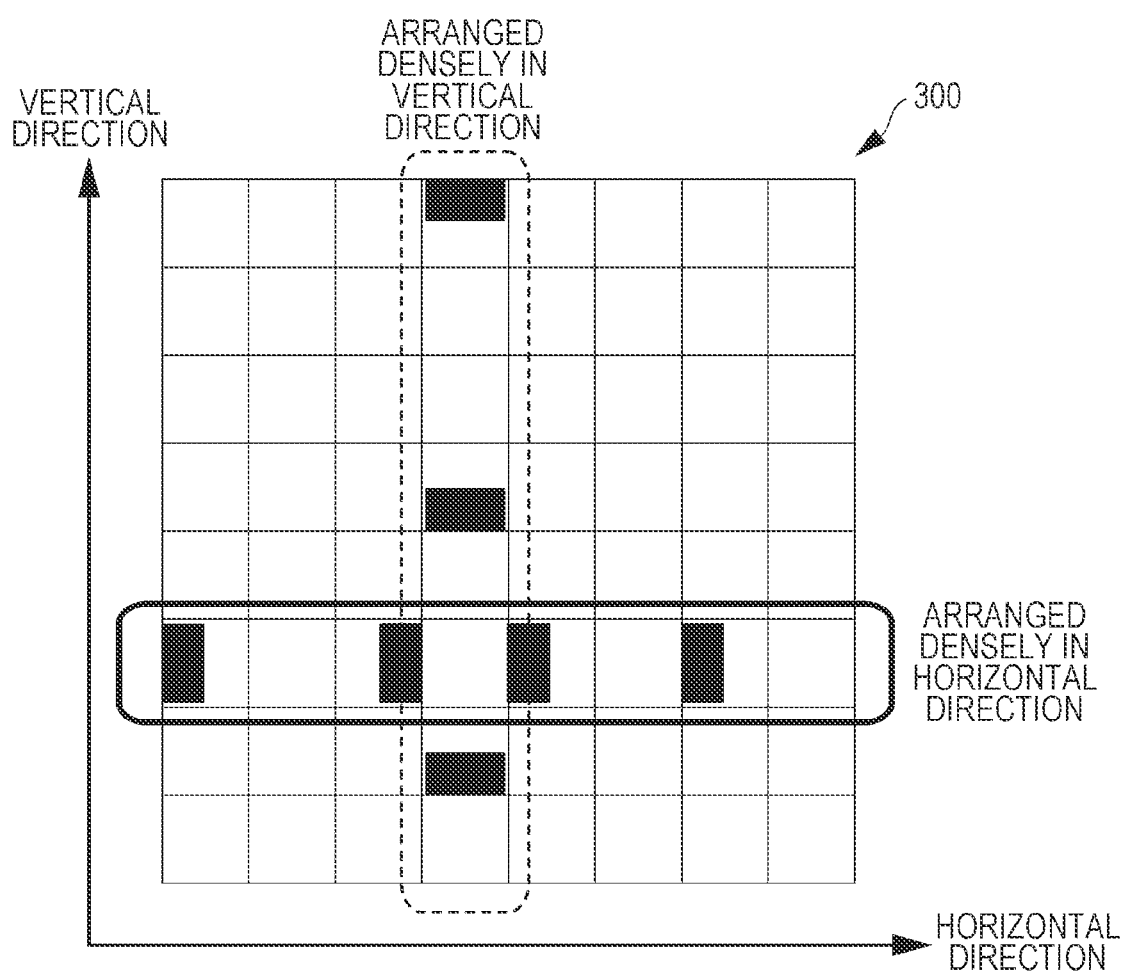
FIG. 8 is a diagram illustrating a configuration of an image capture element according to the first embodiment.

Next, a configuration of the image capture element 300 that is optimal for performing the processing described above will be described with reference to FIG. 8. In this description, the image capture element 300 is the image capture element 300 provided with a phase difference detection pixel 310 for image plane phase-detection AF. In FIG. 8, each rectangular frame indicates a pixel of the image capture element 300, and a black rectangle indicates the phase difference detection pixel 310.

As described above, the anamorphic lens 101 has different focal lengths in the vertical and horizontal directions and generally has a short focal length in the horizontal direction. An image is recorded in a state that the image is compressed in the horizontal direction when imaging, and it is possible to reproduce a horizontally long image by stretching the image in the horizontal direction when reproducing the image. Therefore, as illustrated in FIG. 8, it is preferable that the image capture element 300 also has different arrangement intervals of the phase difference detection pixels between the vertical direction and the horizontal direction.

Since the anamorphic lens 101 has different focal lengths in the vertical and horizontal directions and generally has a shorter focal length in the horizontal direction, the phase difference detection pixels are arranged to be sparser in the vertical direction than the horizontal direction and denser in the horizontal direction than the vertical direction. It is because the image is recorded in a compressed state in the horizontal direction, and it is necessary to sample the phase difference detection pixels more densely. Note that, regarding the arrangement intervals of the phase difference detection pixels in the vertical and horizontal directions illustrated in FIG. 8, the arrangement interval in the vertical direction is twice the arrangement interval in the horizontal direction, but this is just an example, and the present technology is not limited to the arrangement interval. The density of the phase difference detection pixels in the horizontal direction should be increased from the density in the vertical direction in accordance with the anamorphic ratio.

Depending on the frequency of the subject also, the MTF characteristics in the vertical direction and the MTF characteristics in the horizontal direction change and become different from each other. Even for the same subject, the MTF characteristics differ between the vertical and horizontal directions.

Therefore, in order to accurately acquire the MTF characteristics in the vertical and horizontal directions, it is desirable to configure the image capture element 300 as illustrated in FIG. 8.

Note that, in addition to the phase difference detection pixels, it is also possible to perform convolution and frequency characteristics of a filter for noise reduction of normal pixels according to the difference in focal lengths between the vertical and horizontal directions of the anamorphic lens 101.

Furthermore, in a case where the arrangement densities of the phase difference detection pixels in the image capture element 300 are the same between the vertical and horizontal directions, for example, it is also possible to configure that the filter for noise reduction is changed between the vertical and horizontal directions.

Figure 9:
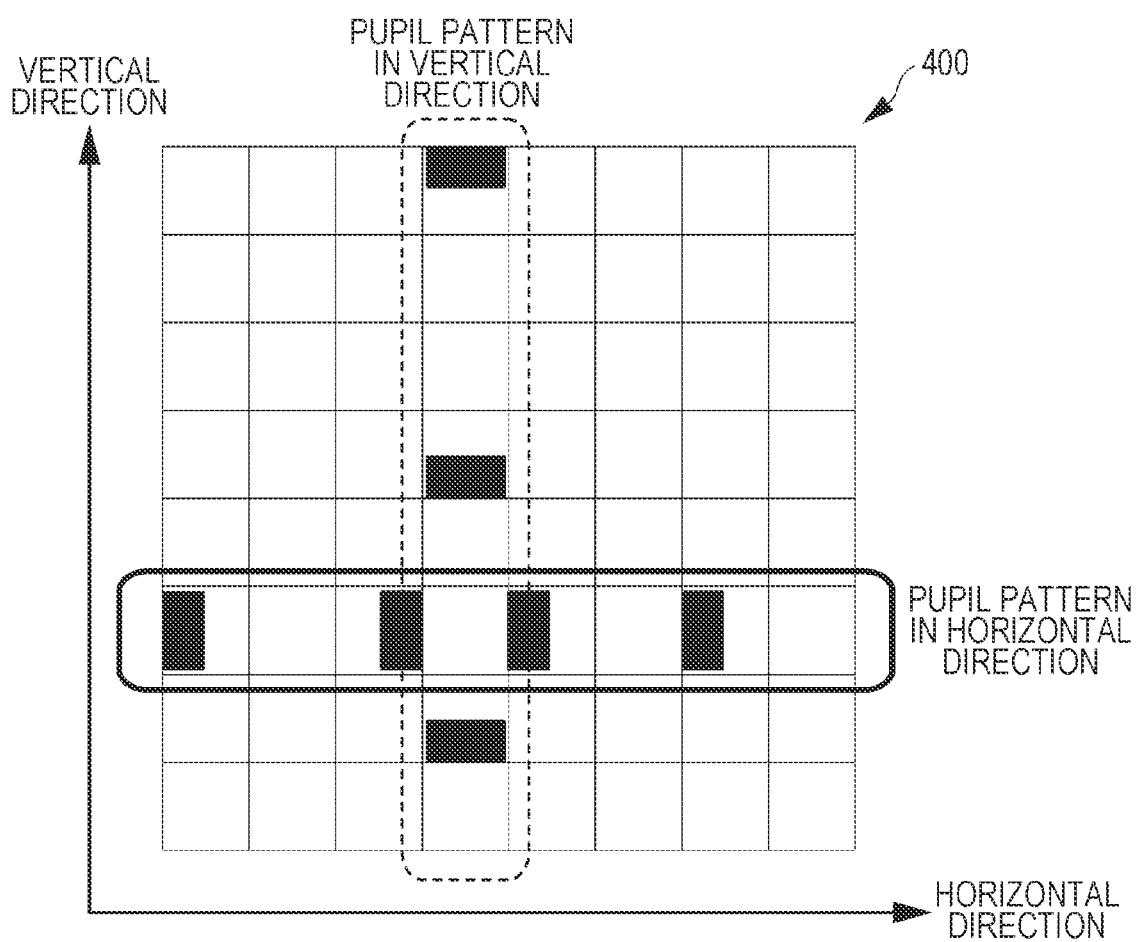
FIG. 9 is an explanatory diagram of an exit pupil distance according to the first embodiment.

Also, as illustrated in FIG. 9, in an image capture element 400, a pupil pattern used in image plane phase-detection AF may be changed according to an exit pupil distance (EPD) in the vertical and horizontal directions. The rows and columns of the phase difference pixels correspond to the exit pupil of the lens, and a light-shielding position is modulated in an image height direction. In a case of a camera whose lens is interchangeable, since long and short exit pupils exist, detection is performed by selecting a row of phase difference pixels and a column of phase difference pixels appropriate for the lens. Various types of rows of phase difference pixels and columns of phase difference pixels are referred to as pupil patterns. Since the anamorphic lens 101 has different focal lengths between the vertical and horizontal directions, the exit pupil distance may also differ between the vertical and horizontal directions in some cases. Therefore, in the image capture element 400, the pattern of the pupil in the vertical direction is set to be different from the pattern of the pupil in the horizontal direction. For example, as illustrated in FIG. 9, it is preferable to increase the pattern of the pupil used in the horizontal direction from the vertical direction in accordance with the anamorphic ratio of the anamorphic lens 101.

Note that the image capture elements 300 and 400 described with reference to FIGS. 8 and 9 are not essential for autofocus in the image capture device 100 including the anamorphic lens 101 in the first embodiment, but it is possible to improve the accuracy of autofocus by using the image capture elements 300 and 400 configured as described above.

As described above, the image capture device 100 and the signal processing device 150 according to the first embodiment are configured. According to the first embodiment, it is possible to realize autofocus even in the image capture device 100 provided with the anamorphic lens 101.

Also, according to the first embodiment, since the autofocus is not realized by a two-step process such as focusing in one of the vertical and horizontal directions and then focusing in the other direction, it is possible to perform autofocus at high speed even in the image capture device 100 provided with the anamorphic lens 101. Also, there is an advantage that it is possible to realize autofocus in the image capture device 100 including the anamorphic lens 101 by using a small number of parts.

2. Second Embodiment

[2-1. Configuration of Image Capture Device]

Next, a second embodiment of the present technology will be described. In the second embodiment, in an image capture device 200 including the anamorphic lens 101, by the detection process, an edge (a change in brightness between adjacent pixels (contrast)) as characteristics in the vertical direction of the anamorphic lens 101 and as characteristics in the horizontal direction of the anamorphic lens 101 is detected in each of the directions, and the peaking process is performed on the basis of the edge.

Peaking is a process of detecting a high-frequency component in an image, identifying an in-focus portion of the subject, and emphasizing and displaying the pixels constituting the edge of the subject. The process of emphasizing pixels that constitute the edge portion is performed by drawing the pixels with markers in a predetermined color to increase the lines along the edges of the subject or thickening the lines along the contour of the subject. Also, the process may be performed by changing the brightness or color tone of the pixels or superimposing a signal for the emphasizing process on the pixels. It is also possible to relatively reduce the brightness and color tone of pixels other than the pixels to be emphasized so that the pixels other than the pixels to be emphasized are displayed blurred. If it is possible to distinguish the pixels to be emphasized from other pixels, the enhancement method is not limited to a specific method.

As described with reference to FIG. 2, the anamorphic lens 101 has different MTF characteristics between the vertical and horizontal directions, and the MTF value is less likely to decrease in the horizontal direction. Therefore, since the MTF values are in the higher range and the range of the amount of defocus, which is regarded to be in focus, is wider in the horizontal direction compared to the vertical direction, there is a possibility that the emphasizing process by accurate peaking cannot be performed if the peaking process in the vertical and horizontal directions is performed by the same process in some cases. Therefore, in the second embodiment, edges are detected by the detection process in each of the vertical and horizontal directions of the image corresponding to each of the vertical and horizontal directions of the anamorphic lens 101 to perform the peaking process.

Figure 10:
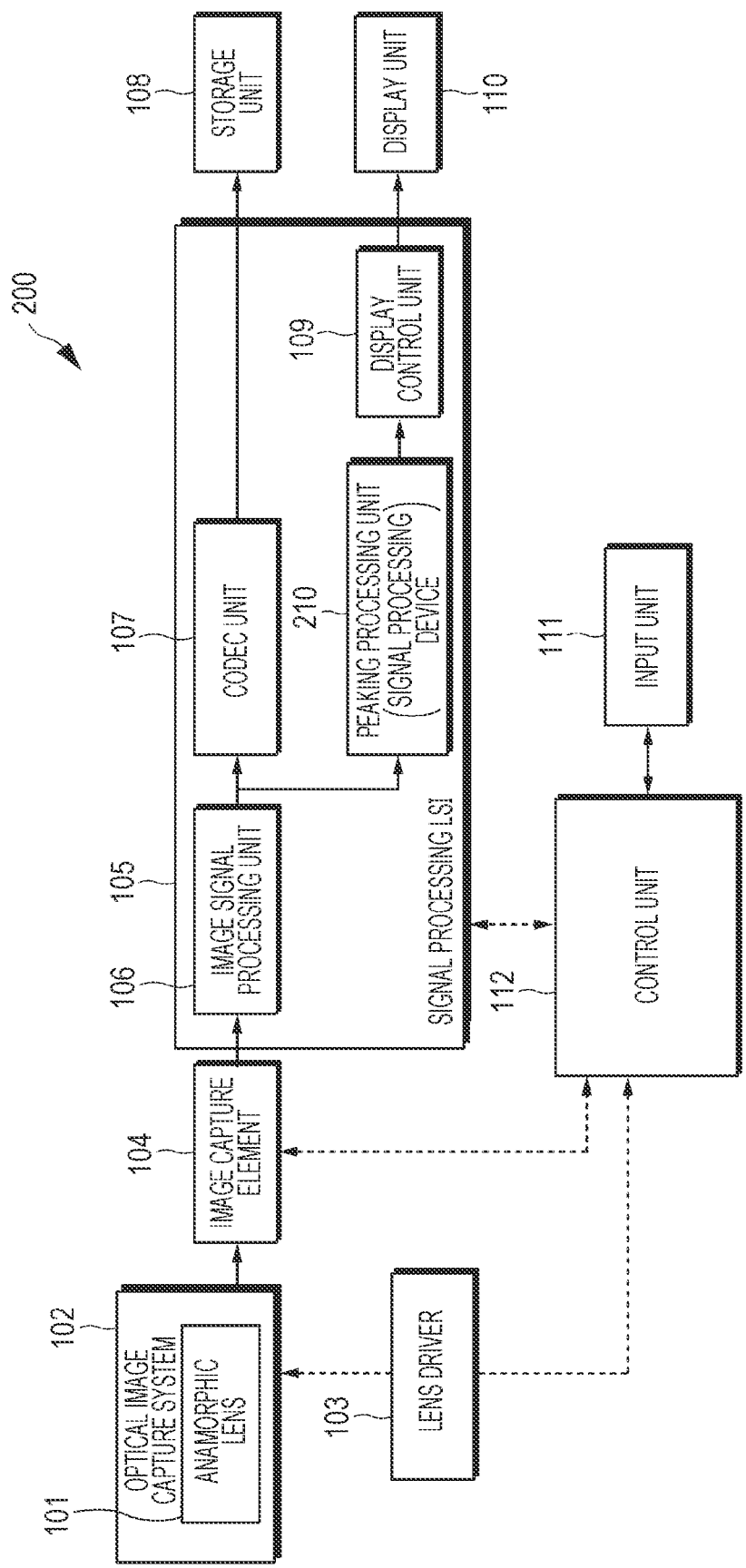
FIG. 10 is a block diagram illustrating a configuration of an image capture device according to a second embodiment.

A configuration of the image capture device 200 including a peaking processing unit 210 as a signal processing device according to the second embodiment will be described with reference to FIG. 10.

The image capture device 200 includes an optical image capture system 102 including an anamorphic lens 101, a lens driver 103, an image capture element 104, a signal processing LSI 105, an image signal processing unit 106, a codec unit 107, a storage unit 108, a display control unit 109, a display unit 110, an input unit 111, a control unit 112, and a peaking processing unit 210 as a signal processing device. The same configurations as in the first embodiment are designated by the same signs, and the description thereof will be omitted.

Figure 11:
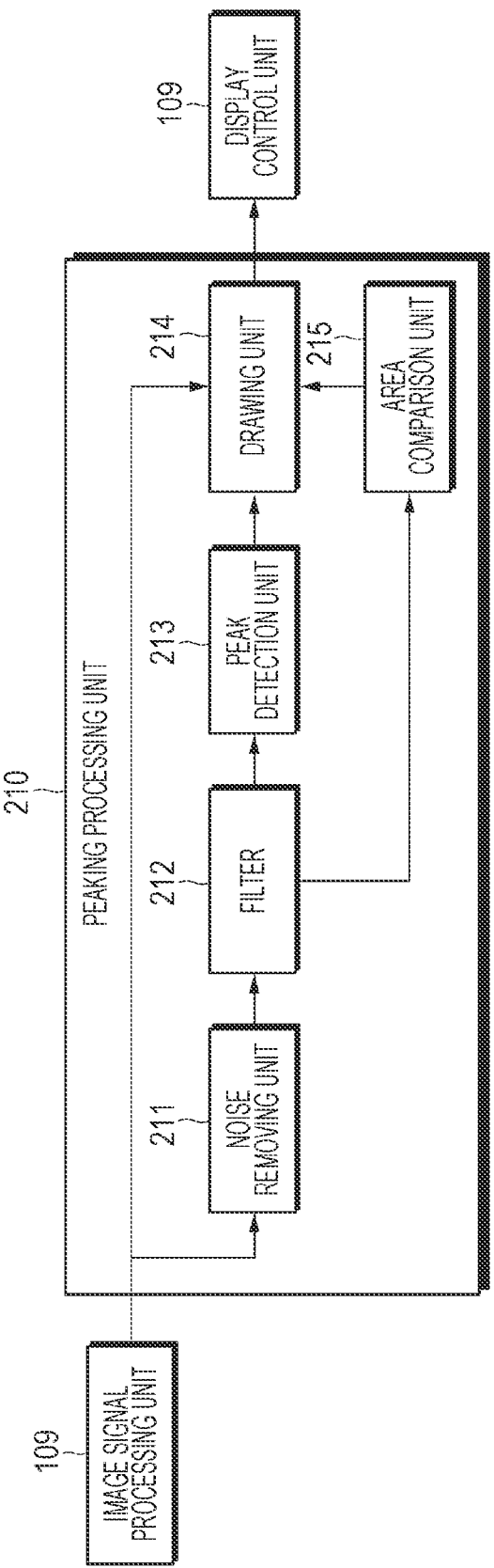
FIG. 11 is a block diagram illustrating a configuration of a peaking processing unit.

A configuration of the peaking processing unit 210 will be described with reference to FIG. 11. The peaking processing unit 210 separately performs the peaking process in each of the vertical and horizontal directions of the image. It is because the anamorphic lens 101 has different focal lengths between the vertical and horizontal directions, so it is appropriate to perform the peaking process individually in the vertical direction and the horizontal direction.

Peaking settings for performing peaking include a band of a filter 212 having a predetermined filter coefficient for extracting high-frequency components from the image and a reaction sensitivity for detecting a peak signal by comparing with the energy of the high-frequency components in the image. The reaction sensitivity is adjusted by raising or lowering a gain or a peaking threshold of the filter 212. To raise the reaction sensitivity, raise the gain or lower the peaking threshold of the filter 212. To lower the reaction sensitivity, lower the gain or raise the peaking threshold of the filter 212. Hereinafter, the adjustment of the reaction sensitivity will be described as being performed by raising or lowering the peaking threshold.

The peaking processing unit 210 performs the emphasizing process by peaking in a case where the energy of the high-frequency component in the image exceeds the peaking threshold. In this peaking, the high-frequency component extraction process by the filter 212 having a predetermined filter coefficient, the comparison process between the energy of the extracted high-frequency component and the peaking threshold, and the drawing process that emphasizes the pixels whose energy of the high-frequency component is determined to be larger than the peaking threshold. In order to perform peaking with high accuracy, it is necessary to extract high-frequency components by the filter 212 as much as possible. By performing peaking, it is possible to emphasize a subject that is in focus in the image. Therefore, the user can easily perform focusing by focusing on the image so that the number of emphasized points due to peaking increases.

The peaking processing unit 210 includes a noise removing unit 211, a filter 212, a peak detection unit 213, a drawing unit 214, and an area comparison unit 215.

The noise removing unit 211 sets a threshold value for removing noise for energy in the image, removes low-level edge components, removes high-frequency component noise, and the like.

The filter 212 is, for example, a high-pass filter having a predetermined filter coefficient, and the filter 212 identifies the area in the image where the subject is in focus (focusing area) by detecting an edge, that is a high-frequency component of the image and is a change in brightness between adjacent pixels (contrast). This process corresponds to edge detection by the detection process. The band of the filter as the peaking setting described above is the band of the filter 212.

The peak detection unit 213 compares the peaking threshold with the energy of the high-frequency component of the image and detects a peak signal that is equal to or higher than the peaking threshold. The peaking threshold as the peaking setting described above is a threshold value used for detecting the peak signal in the peak detection unit 213.

The drawing unit 214 performs a peaking process for emphasizing a pixel whose energy of the high-frequency component is determined to be larger than the peaking threshold by comparison with the peaking threshold. In the present technology, the drawing process emphasizes the in-focus portion of the subject by detecting the high-frequency component in the image, identifying the in-focus portion of the subject, and drawing a marker on the pixels constituting the edge of the subject.

The area comparison unit 215 performs a process of comparing the size of an area in which the subject is in focus in the image in each of the vertical and horizontal directions supplied from the filter 212. The area comparison result is supplied to the drawing unit 214. On the basis of this area comparison result, the drawing unit 214 performs the drawing process so as to make a difference in the degree of emphasis between the area in focus in the vertical direction and the area in focus in the horizontal direction.

Note that the peaking processing unit 210 as a signal processing device includes a program, and the program may be installed in the image capture device 200 preliminarily or may be distributed by download, storage medium, or the like so that the user may install the program by himself/herself. Note that the peaking processing unit 210 is not only realized by a program but may also be realized by combining a dedicated device, a circuit, or the like by hardware having the function.

[2-2. Peaking Process]

Figure 13:
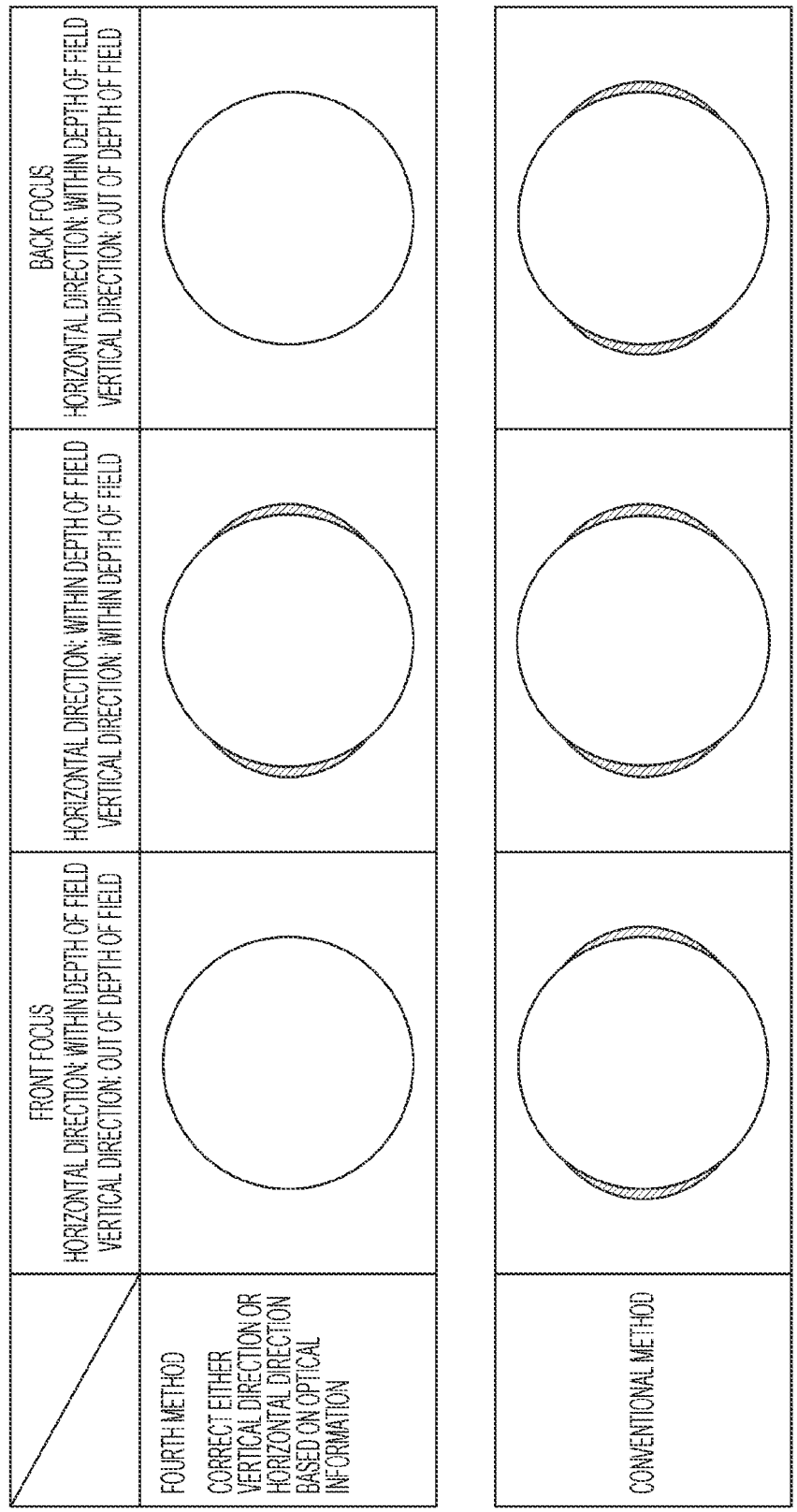
FIG. 13 is an explanatory diagram of peaking drawing.

Next, the peaking process in the second embodiment will be described with reference to FIGS. 12 and 13. There are first to fifth methods for the peaking process. FIG. 13 also illustrates an aspect of an emphasizing process of the conventional general peaking process as a comparative example.

In FIGS. 12 and 13, the subject to be focused on is a circular object from the viewpoint of easy-understanding of the emphasizing process that performs peaking in the vertical and horizontal directions. Then, portions emphasized by peaking are illustrated with slant lines. Also, the number of slant lines indicates the strength (degree) of emphasis on peaking.

Also, for convenience of explanation, it is assumed that the peak positions of focus in the vertical and horizontal directions (MTF peaks) are almost the same. Also, it is assumed that the depth of field in the horizontal direction is deep and the depth of field in the vertical direction is shallower than the depth of field in the horizontal direction. Also, it is assumed that the vertical direction of the anamorphic lens 101 and the vertical direction of the image correspond to each other and match the direction and the horizontal direction of the anamorphic lens 101 and the horizontal direction of the image correspond to each other and match the direction.

In the first method, the emphasizing process by peaking is performed on an area that is in focus in each of the vertical direction and the horizontal direction. Therefore, in a case where the subject is in focus in the vertical direction and also the subject is in focus in the horizontal direction (within the depth of field in both of the vertical and horizontal directions), the emphasizing process by peaking is performed on the area where being in-focus in both of the vertical and horizontal directions.

Also, in this first method, in a case where being out of the depth of field in the vertical direction and also within the depth of field in a front focus state, the emphasizing process by peaking is performed only in the horizontal direction. Also, in the first method, in a case where being out of the depth of field in the vertical direction and also within the depth of field in the horizontal direction in a back focus, the emphasizing process by peaking is performed only in the horizontal direction.

Note that the front focus refers to a state in which another subject in front of the main subject to be imaged by the user is in focus. Also, the back focus refers to a state in which the main subject to be imaged by the user is out of focus and another subject behind is in focus.

In this first method, the area comparison unit 215 does not need to compare the areas that are in focus in the vertical and horizontal directions.

In the second method, the emphasizing process by peaking is performed only in either the vertical direction or the horizontal direction whichever has a narrower area being in focus. Therefore, in a case where the in-focus area in the vertical direction is narrower than the in-focus area in the horizontal direction, the emphasizing process by peaking is performed only in the vertical direction. In the front focus state and the back focus state, the emphasizing process by peaking is not performed.

In this second method, the area comparison unit 215 compares which area being in focus in the vertical direction or the horizontal direction is narrower and supplies the comparison result to the drawing unit 214. Then, the drawing unit 214 performs the drawing process only in either the vertical direction or the horizontal direction in which the area being in focus is narrower.

In the third method, in either the vertical direction or the horizontal direction, the emphasizing process is performed strongly in the direction in which the area being in focus is narrower, and the emphasizing process is performed weakly in the direction in which the area being in focus is wider. For example, in a case where the area being in focus in the vertical direction is narrower than the area being in focus in the horizontal direction, the emphasizing process is performed strongly on the area being in focus in the vertical direction. On the other hand, the emphasizing process is performed weakly on the area being in focus in the horizontal direction.

In this third method, the area comparison unit 215 compares which area being in focus in the vertical direction or the horizontal direction is narrower and supplies the comparison result to the drawing unit 214. Then, in either the vertical direction or the horizontal direction, the drawing unit 214 performs the drawing process so as to strongly emphasize the direction in which the area being in focus is narrower and performs the drawing process so as to weakly emphasize the direction in which the area being in focus is wider. The strong emphasizing process and the weak emphasizing process include, for example, a difference in the number of lines along the edge of the subject, a difference in the thickness of lines along the contour of the subject, and the like.

As illustrated in FIG. 13, the fourth method detects an area being in focus in either one direction of the vertical direction or the horizontal direction, corrects the area being in focus from optical information in the other direction, and performs the emphasizing process. Here, the optical information is information regarding a depth of field, and more specifically, is an F value. In a case of detecting an area being in focus only in the horizontal direction, since the depth of field in the horizontal direction is wider than the depth of field in the vertical direction, the emphasizing and displaying process is performed only in the horizontal direction as in the conventional method illustrated in FIG. 13. However, considering the depth of field in both the vertical and horizontal directions, it is possible to display the area being in focus better rather by performing the displaying process in the direction in which the area being in focus is narrower as in the second method in FIG. 12. Therefore, by displaying the depth area detected in the horizontal direction by narrowing the area by, for example, the ratio of the F values in the vertical and horizontal directions, as illustrated in FIG. 13, it is possible to emphasize and display the direction in which the area being in focus is narrower.

The fifth method is to change a method of emphasizing peaking (color, shape, number of lines, thickness, and the like) each in the vertical direction and the horizontal direction to perform the emphasizing process and let the user select where to focus.

As described above, the second embodiment of the present technology is configured. According to this second embodiment, even in the image capture device 200 including the anamorphic lens 101 having different focal lengths each in the vertical direction and the horizontal direction, it is possible to perform the peaking process appropriately.

Note that the user may be able to select which of the first to fifth methods described above is used for the peaking process.

Also, the peaking process of the second embodiment can be used in a live viewing when both imaging a still image and imaging a moving image.

Third Embodiment

[3-1. Configuration of Image Capture Device]

Figure 14:
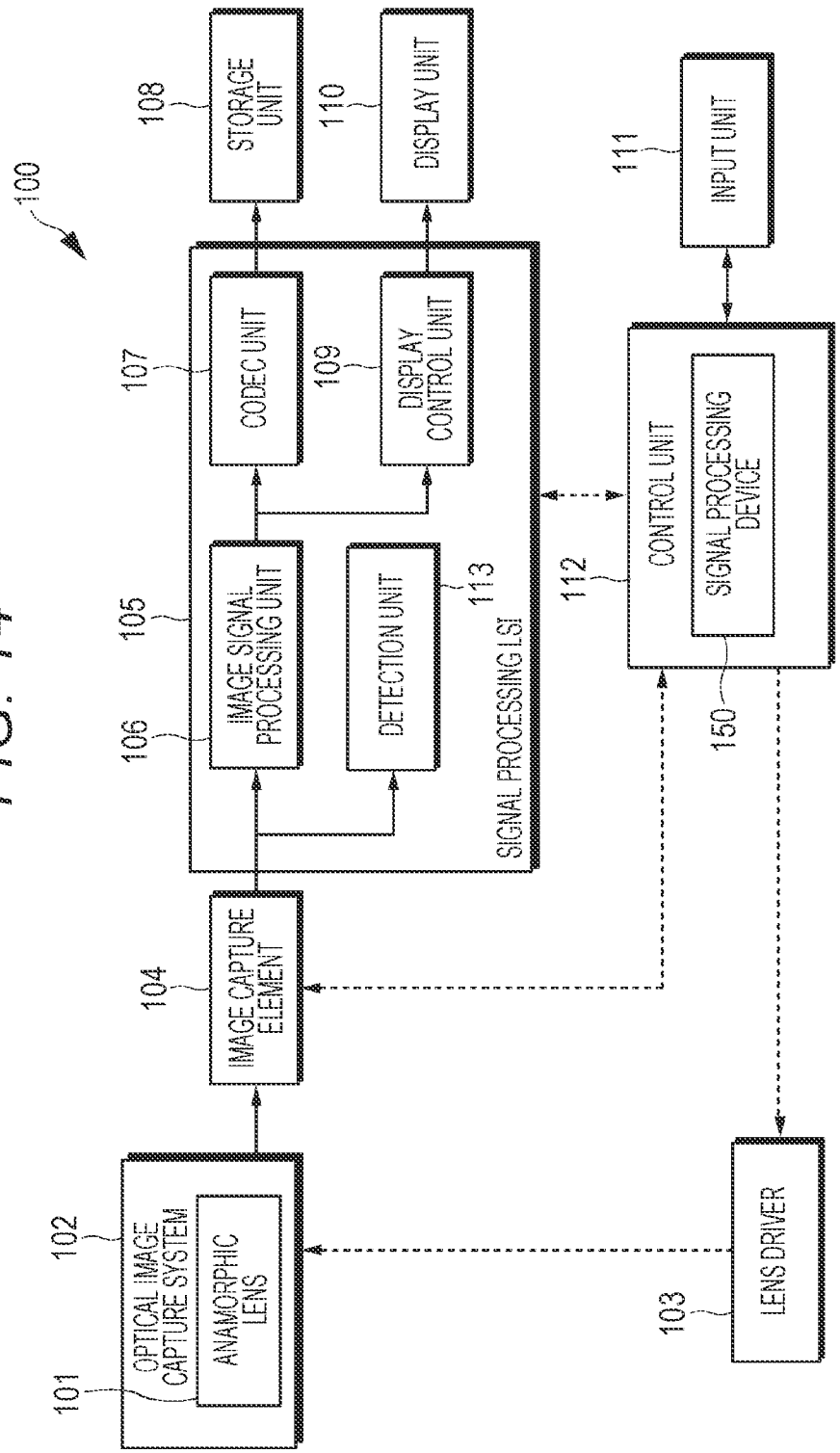
FIG. 14 is a block diagram illustrating a configuration of an image capture device according to a third embodiment.

Next, a third embodiment of the present technology will be described. The third embodiment is different from the first embodiment in that the signal processing device 150 performs the focus adjustment process. FIG. 14 is a block diagram illustrating a configuration of an image capture device 100 according to the third embodiment. Since the configuration of the image capture device 100 other than the signal processing device 150 is similar to the configuration of the first embodiment, the description thereof will be omitted. The signal processing device 150 performs a fine focus adjustment process and focus bracket imaging process described below on the basis of a predetermined parameter of the image capture device 100.

[3-2. First Focus Adjustment Process by Signal Processing Device: Fine Focus Adjustment]

A first aspect of the second embodiment is the fine focus adjustment process in the image capture device 100 including the anamorphic lens 101.

Fine focus adjustment is a function that when the user changes an adjustment amount set corresponding to the focus position, for example, by increasing by one or decreasing by one, by changing the focus position (in-focus position) according to the change in the value, the user can adjust the focus position manually. The image capture device 100 of the present embodiment has this fine focus adjustment function.

Figure 15:
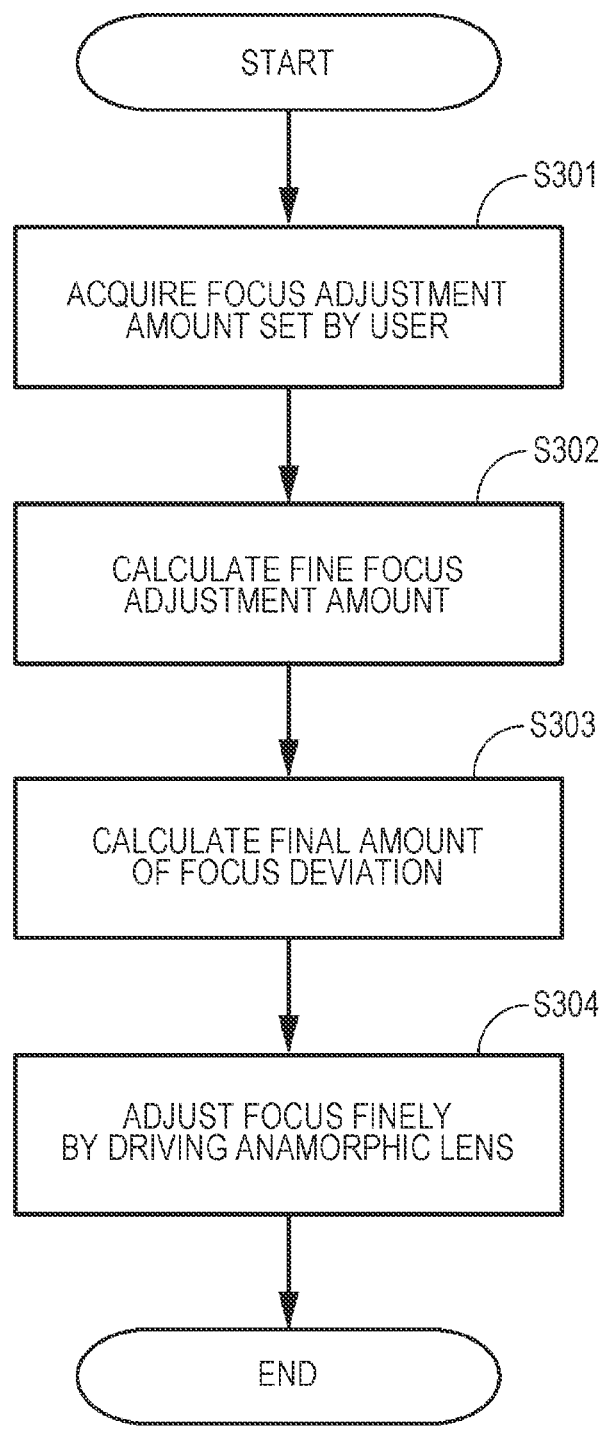
FIG. 15 is a flowchart illustrating a process of a first aspect of a focus adjustment process of the third embodiment.

A flow of the fine focus adjustment process in the signal processing device 150 will be described with reference to FIG. 15. First, in step S301, a focus adjustment amount P1 changed by the user is acquired.

Next, in step S302, a fine focus adjustment amount is calculated using Formula 3 below.

$$\text{Fine focus adjustment amount} = P1 \cdot \sqrt{(\text{horizontal } F \text{ value} \times \text{vertical } F \text{ value})} \times d3 \qquad \text{[Formula 3]}$$

The parameter d3 in Formula 3 is a constant for determining the allowable focus width. Note that [Formula 3] takes the geometric mean in the horizontal and vertical directions, but it is not limited to this, and there is also a method of calculating with an arithmetic mean or a weighted mean that is weighted in the horizontal direction/vertical direction.

Then, in step S303, a final amount of focus deviation for driving the lens for autofocus is calculated using Formula 4 below. The "calculated amount of focus deviation" in Formula 4 is the amount of focus deviation with respect to the in-focus position calculated in autofocus.

Final amount of focus deviation=Calculated amount of focus deviation+Fine focus adjustment amount  [Formula 4]

Then, in step S304, the anamorphic lens 101 is driven by the lens driver 103 on the basis of the final amount of focus deviation calculated in step S303 to finely adjust the focus.

The first aspect of processing in the signal processing device 150 is configured as described above. According to the first aspect of the third embodiment, the user can use the function of adjusting focus finely even in the image capture device 100 provided with the anamorphic lens without any special operation or handling.

[3-3. Second Focus Adjustment Process by Signal Processing Device: Focus Bracket Imaging]

Next, a second aspect of processing in the signal processing device 150 of the third embodiment will be described. The second aspect is a focus bracket (also referred to as a focus bracket) imaging process in the image capture device 100 including the anamorphic lens 101.

Focus bracket imaging is a function that images continuously until finishing capturing a set number of images while moving the focus position with a preset amount of focus bracket by one shutter operation. All captured images have different focus positions. More specifically, a plurality of images is captured by shifting from the in-focus position as a center by the amount of focus deviation for each imaging. For example, in a case where the amount of bracket is b and the number of images to be captured is five, images are captured as follows.

First image: amount of b×2 from the in-focus position, front focus

Second image: amount of b×1 from the in-focus position, front focus

Third image: in-focus position

Fourth image: amount of b×1 from the in-focus position, back focus

Fifth image: amount of b×2 from the in-focus position, back focus

Figure 16:
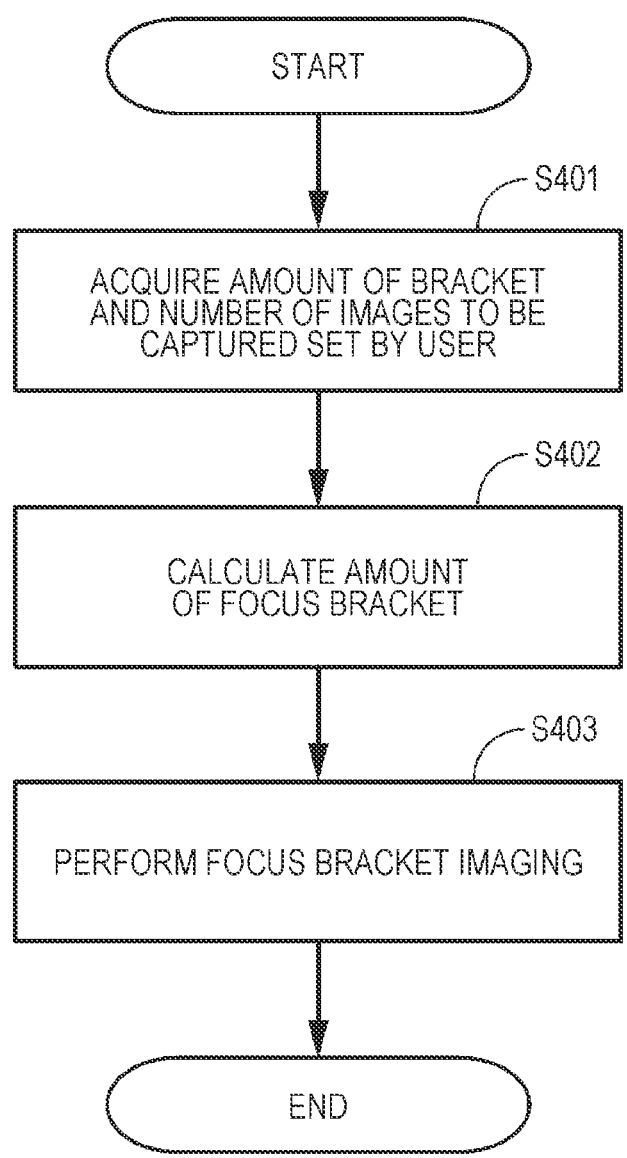
FIG. 16 is a flowchart illustrating a process of a second aspect of the focus adjustment process of the third embodiment.

A flow of the focus bracket imaging process by the signal processing device 150 will be described with reference to FIG. 16. First, in step S401, an amount of focus bracket P2 and the number of images to be captured set by the user are acquired. These parameters can be obtained from the setting information of the focus bracket of the image capture device 100.

Next, in step S402, the amount of focus bracket used in actual imaging is calculated using Formula 5 below.

Amount of focus bracket=$P2 \cdot \sqrt{\text{(horizontal } F \text{ value} \times \text{vertical } F \text{ value)} \times d5}$  [Formula 5]

The parameter d5 in Formula 5 is a constant for determining the allowable focus width and is a value determined according to a pixel pitch such as, for example, "a value obtained by a predetermined number of times the minimum unit of a pixel" and the like. Note that [Formula 5] takes the geometric mean in the horizontal and vertical directions, but it is not limited to this, and there is also a method of calculating with an arithmetic mean or a weighted mean that is weighted in the horizontal direction/vertical direction.

Then, in step S403, under the control of the signal processing device 150, by causing the anamorphic lens 101 to operate by the lens driver 103 according to the amount of focus bracket, focus bracket imaging is performed according to the amount of focus bracket and the number of images to be captured.

As described above, the third embodiment of the present technology is configured. According to this third embodiment, even in the image capture device 100 provided with an anamorphic lens, without any special treatment, it is possible to use fine focus adjustment and the focus bracket imaging function, which are the functions provided in an ordinary camera.

The second aspect of the processing in the signal processing device 150 is configured as described above. According to the second aspect of the third embodiment, the user can use the function of focus bracket imaging even in the image capture device 100 provided with the anamorphic lens without any special operation or handling.

As described above, the third embodiment of the present technology is configured. According to this third embodiment, even in the image capture device 100 provided with an anamorphic lens, without any special treatment, it is possible to use the fine focus adjustment function and focus bracket imaging function, which are the functions provided in an ordinary camera.

4. Modification Example

Although the embodiments of the present technology have been specifically described above, the present technology is not limited to the above-described embodiments, and various types of modifications based on the technical idea of the present technology are possible.

It is possible to apply the first embodiment to any of the phase-detection AF method, the contrast AF method, and the image plane phase-detection AF method.

In the second embodiment, it has been described that the peaking processing unit 210 performs the peaking process separately for each of the vertical direction and the horizontal direction of the image, but it is also possible to provide a first peaking processing unit for the vertical direction and a second peaking processing unit for the horizontal direction.

The present technology may also be configured as below.

(1)

A signal processing device that, on the basis of an image capture signal acquired by an image capture device provided with an anamorphic lens, performs a detection process each in a vertical direction of the anamorphic lens and in a horizontal direction of the anamorphic lens.

(2)

The signal processing device according to (1), in which the signal processing device determines an in-focus position on the basis of a characteristic in the vertical direction of the anamorphic lens and a characteristic in the horizontal direction of the anamorphic lens acquired by the detection process.

(3)

The signal processing device according to (2), in which the characteristic is an MTF characteristic, which is represented by an MTF value and an in-focus position which is represented by an amount of defocus in the vertical direction of the anamorphic lens.

(4)

The signal processing device according to (2) or (3), in which the signal processing device determines the in-focus position on the basis of an average of the amount of defocus corresponding to a peak of the MTF characteristic in the vertical direction of the anamorphic lens and the amount of defocus corresponding to a peak of the MTF characteristic in the horizontal direction of the anamorphic lens.

(5)

The signal processing device according to any one of (2) to (4), in which the signal processing device determines a position where a value calculated from a first evaluation formula is maximized as the in-focus position by using the MTF characteristic in the vertical direction of the anamorphic lens and the MTF characteristic in the horizontal direction of the anamorphic lens.

(6)

The signal processing device according to any one of (2) to (5), in which the signal processing device determines a position where a value calculated from a second evaluation formula is maximized as the in-focus position by using the MTF characteristic in the vertical direction of the anamorphic lens, the MTF characteristic in the horizontal direction of the anamorphic lens, and tilt information of a subject.

(7)

The signal processing device according to any one of (2) to (6), in which the signal processing device determines the in-focus position on the basis of a degree of reliability of the detection.

(8)

The signal processing device according to (7), in which the degree of reliability is an evaluation value of a block matching process performed each in the vertical direction and in the horizontal direction as the detection process.

(9)

The signal processing device according to any one of (2) to (8), in which the signal processing device determines a focus adjustment method on the basis of whether an MTF characteristic is present or absent and whether information regarding an angle of a subject is present or absent.

(10)

The signal processing device according to (1), in which the signal processing device performs a peaking process on the basis of a characteristic in the vertical direction of the anamorphic lens and a characteristic in the horizontal direction of the anamorphic lens acquired by the detection process.

(11)

The signal processing device according to (10), in which the characteristic is a change in brightness between adjacent pixels.

(12)

The signal processing device according to (10) or (11), in which the signal processing device performs a peaking process on an area in the image being in focus in the vertical direction and an area in the image being in focus in the horizontal direction.

(13)

The signal processing device according to any one of (10) to (12), in which the signal processing device performs the peaking process only on an area being narrower, between the area in the image being in focus in the vertical direction and the area in the image being in focus in the horizontal direction.

(14)

The signal processing device according to any one of (10) to (13), in which the signal processing device performs the peaking process so as to emphasize an area being narrower than an area being wider, between the area in the image being in focus in the vertical direction and the area in the image being in focus in the horizontal direction.

(15)

The signal processing device according to (1), in which the signal processing device performs a focus adjustment process in the image capture device on the basis of an in-focus position determined by the detection process and a predetermined parameter.

(16)

The signal processing device according to (15), in which the signal processing device performs a focus adjustment process on the basis of an F value in a direction corresponding to the vertical direction of the anamorphic lens and an F value in a direction corresponding to the horizontal direction of the anamorphic lens as the predetermined parameters.

(17)

The signal processing device according to (15) or (16), in which the signal processing device sets an amount of focus bracket in a focus bracket imaging, as the focus adjustment process, on the basis of the F value in the direction corresponding to the vertical direction of the anamorphic lens and the F value in the direction corresponding to the horizontal direction of the anamorphic lens as the predetermined parameter.

(18)

A signal processing method including performing a detection process, on the basis of an image capture signal acquired by an image capture device provided with an anamorphic lens, each in a vertical direction of the anamorphic lens and in a horizontal direction of the anamorphic lens.

(19)

A signal processing program for, on the basis of an image capture signal acquired by an image capture device provided with an anamorphic lens, causing a computer to execute a signal processing method including performing a detection process each in the vertical direction of the anamorphic lens and in the horizontal direction of the anamorphic lens.

(20)

An image capture device including:

an anamorphic lens;

an image capture element that is provided with a plurality of phase difference detection pixels arranged to make placement densities different between a direction corresponding to a vertical direction of the anamorphic and a direction corresponding to a horizontal direction orthogonal to the vertical direction of the anamorphic lens; and a signal processing unit that performs a detection process each in the vertical direction of the anamorphic lens and in the horizontal direction of the anamorphic lens on the basis of an image capture signal acquired by the image capture element.

(21)

The image capture device according to (20), in which the image capture device performs autofocus control on the basis of an in-focus position determined by the detection process.

REFERENCE SIGNS LIST

100, 200 Image capture device
104 Image capture element
150 Signal processing device
210 Peaking processing unit

The invention claimed is:

1. A signal processing device, comprising:
the signal processing device configured to:
perform, based on an image capture signal acquired by an image capture device with an anamorphic lens, a detection process in each of a vertical direction of the anamorphic lens and a horizontal direction of the anamorphic lens;

acquire, based on the detection process, detection information in each of the vertical direction of the anamorphic lens and the horizontal direction of the anamorphic lens; and determine an in-focus position of a subject based on the acquired detection information.

2. The signal processing device according to claim 1, wherein the acquired detection information includes:

an MTF characteristic represented by an MTF value, and the in-focus position represented by an amount of defocus in the vertical direction of the anamorphic lens.

3. The signal processing device according to claim 1, wherein the acquired detection information includes an MTF characteristic represented by an MTF value, and the signal processing device is further configured to determine the in-focus position based on an average of an amount of defocus corresponding to a peak of the MTF characteristic in the vertical direction of the anamorphic lens and an amount of defocus corresponding to a peak of the MTF characteristic in the horizontal direction of the anamorphic lens.

4. The signal processing device according to claim 1, wherein the acquired detection information includes an MTF characteristic represented by an MTF value, and the signal processing device is further configured to:

determine, based on the MTF characteristic in the vertical direction of the anamorphic lens and the MTF characteristic in the horizontal direction of the anamorphic lens, a position where a value calculated from a first evaluation formula is maximum; and set the determined position as the in-focus position.

5. The signal processing device according to claim 1, wherein the acquired detection information includes an MTF characteristic represented by an MTF value, and the signal processing device is further configured to:

determine, based on the MTF characteristic in the vertical direction of the anamorphic lens, the MTF characteristic in the horizontal direction of the anamorphic lens, and tilt information of the subject, a position where a value calculated from a second evaluation formula is maximum; and set the determined position as the in-focus position.

6. The signal processing device according to claim 1, wherein the signal processing device is further configured to determine the in-focus position based on a degree of reliability of the detection process.

7. The signal processing device according to claim 6, wherein the degree of reliability is an evaluation value of a block matching process, and the block matching process corresponds to the detection process performed in each of the vertical direction and the horizontal direction.

8. The signal processing device according to claim 1, wherein the signal processing device is further configured to determine a focus adjustment method based on presence or absence of an MTF characteristic and presence or absence of information associated with an angle of the subject.

9. The signal processing device according to claim 1, wherein the signal processing device is further configured to perform a peaking process on a basis of a characteristic in the vertical direction of the anamorphic lens and a characteristic in the horizontal direction of the anamorphic lens acquired by the detection process.

10. The signal processing device according to claim 9, wherein the characteristic is a change in brightness between adjacent pixels.

11. The signal processing device according to claim 9, wherein the signal processing device is further configured to perform the peaking process on an area in an image being in focus in the vertical direction and an area in the image being in focus in the horizontal direction.

12. The signal processing device according to claim 9, wherein the signal processing device is further configured to perform the peaking process only on an area being narrower, between an area in an image being in focus in the vertical direction and an area in the image being in focus in the horizontal direction.

13. The signal processing device according to claim 9, wherein the signal processing device is further configured to perform the peaking process so as to emphasize an area being narrower than an area being wider, between an area in an image being in focus in the vertical direction and an area in the image being in focus in the horizontal direction.

14. The signal processing device according to claim 1, wherein the signal processing device is further configured to perform a focus adjustment process in the image capture device on a basis of the in-focus position determined by the detection process and a predetermined parameter.

15. The signal processing device according to claim 14, wherein the signal processing device is further configured to perform the focus adjustment process on a basis of an F value in a direction corresponding to the vertical direction of the anamorphic lens and an F value in a direction corresponding to the horizontal direction of the anamorphic lens as the predetermined parameter.

16. The signal processing device according to claim 14, wherein the signal processing device is further configured to set an amount of focus bracket in a focus bracket imaging, as the focus adjustment process, on a basis of an F value in a direction corresponding to the vertical direction of the anamorphic lens and an F value in a direction corresponding to the horizontal direction of the anamorphic lens as the predetermined parameter.

17. A signal processing method, comprising:

performing, based on an image capture signal acquired by an image capture device with an anamorphic lens, a detection process in each of a vertical direction of the anamorphic lens and a horizontal direction of the anamorphic lens;

acquiring, based on the detection process, detection information in each of the vertical direction of the anamorphic lens and the horizontal direction of the anamorphic lens; and determining an in-focus position of a subject based on the acquired detection information.

18. A non-transitory computer-readable medium having stored thereon, computer-executable instructions which, when executed by a computer, cause the computer to execute operations, the operations comprising:

performing, based on an image capture signal acquired by an image capture device with an anamorphic lens, a detection process in each of a vertical direction of the anamorphic lens and in a horizontal direction of the anamorphic lens;

acquiring, based on the detection process, detection information in each of the vertical direction of the anamorphic lens and the horizontal direction of the anamorphic lens; and determining an in-focus position of a subject based on the acquired detection information.

19. An image capture device, comprising:

an anamorphic lens;

an image capture element that includes a plurality of phase difference detection pixels to make placement densities different between a vertical direction of the anamorphic lens and a horizontal direction of the anamorphic lens, wherein the horizontal direction is orthogonal to the vertical direction; and a signal processing unit configured to:
  perform, based on an image capture signal acquired by the image capture element, a detection process in each of the vertical direction of the anamorphic lens and the horizontal direction of the anamorphic lens;
  acquire, based on the detection process, detection information in each of the vertical direction of the anamorphic lens and the horizontal direction of the anamorphic lens; and
  determine an in-focus position of a subject based on the acquired detection information.

20. The image capture device according to claim 19, wherein the image capture device is further configured to:
  determine the in-focus position based on the detection process; and
  perform autofocus control based on the determined in focus position.

\* \* \* \* \*